US010916643B2

(12) United States Patent
Takeuchi et al.

(10) Patent No.: US 10,916,643 B2
(45) Date of Patent: Feb. 9, 2021

(54) SEMICONDUCTOR DEVICE, METHOD FOR CONTROLLING SEMICONDUCTOR DEVICE, AND CONTROL CIRCUIT FOR SEMICONDUCTOR DEVICE

(71) Applicant: Hitachi Power Semiconductor Device, Ltd., Hitachi (JP)

(72) Inventors: Yujiro Takeuchi, Tokyo (JP); Yusuke Hotta, Tokyo (JP); Tomoyuki Miyoshi, Tokyo (JP); Mutsuhiro Mori, Tokyo (JP)

(73) Assignee: Hitachi Power Semiconductor Device, Ltd., Hitachi (JP)

( * ) Notice: Subject to any disclaimer, the term of this patent is extended or adjusted under 35 U.S.C. 154(b) by 0 days.

(21) Appl. No.: 16/769,704

(22) PCT Filed: Oct. 29, 2018

(86) PCT No.: PCT/JP2018/040036
§ 371 (c)(1),
(2) Date: Jun. 4, 2020

(87) PCT Pub. No.: WO2019/111585
PCT Pub. Date: Jun. 13, 2019

(65) Prior Publication Data
US 2020/0395471 A1    Dec. 17, 2020

(30) Foreign Application Priority Data
Dec. 5, 2017   (JP) .................................. 2017-233067

(51) Int. Cl.
*H01L 29/739*  (2006.01)
*H03K 17/16*   (2006.01)
*H03K 17/567*  (2006.01)

(52) U.S. Cl.
CPC ......... *H01L 29/7393* (2013.01); *H03K 17/16* (2013.01); *H03K 17/567* (2013.01)

(58) Field of Classification Search
None
See application file for complete search history.

(56) References Cited

U.S. PATENT DOCUMENTS 5,459,339 A     10/1995  Sakurai et al.
2011/0102037 A1*  5/2011  Cheng .................. H03K 17/223
                                            327/161

(Continued)

FOREIGN PATENT DOCUMENTS

JP   6-125256 A    5/1994
JP   2000-101076 A 4/2000
JP   2017-28811 A  2/2017

OTHER PUBLICATIONS

International Search Report (PCT/ISA/210) issued in PCT Application No. PCT/JP2018/040036 dated Feb. 19, 2019 with English translation (two pages).

(Continued)

*Primary Examiner* — Lincoln D Donovan
*Assistant Examiner* — Khareem E Almo
(74) *Attorney, Agent, or Firm* — Crowell & Moring LLP

(57) ABSTRACT

To provide a semiconductor device in which an IGBT having two gate terminals is driven by one control signal, and a continuous ON state and an ON state twice for one on-pulse signal are avoided. A semiconductor device includes: a control signal input terminal; an IGBT having a first gate terminal and a second gate terminal; a delay unit configured to delay an input signal for a delay time; and a logical product unit configured to calculate a logical product of a first input terminal and a second input terminal. The control signal input terminal is connected to an input terminal of the delay unit and a second input terminal of the (Continued)

logical product unit. An output terminal of the delay unit is connected to the first gate terminal of the IGBT and a first input terminal of the logical product unit. An output terminal of the logical product unit is connected to the second gate terminal of the IGBT.

8 Claims, 14 Drawing Sheets

(56) References Cited

U.S. PATENT DOCUMENTS

| | | | |
|---|---|---|---|
| 2015/0035585 A1* | 2/2015 | Mari Curbelo | H03K 17/567 327/393 |
| 2017/0026034 A1 | 1/2017 | Akiyama | |
| 2017/0248646 A1* | 8/2017 | Mauder | H03K 17/08128 |
| 2018/0287365 A1* | 10/2018 | Djelassi-Tscheck | H03K 17/0822 |
| 2020/0228109 A1* | 7/2020 | Bachhuber | H03K 17/0822 |

OTHER PUBLICATIONS

Japanese-language Written Opinion (PCT/ISA/237) issued in PCT Application No. PCT/JP2018/040036 dated Feb. 19, 2019 (three pages).

* cited by examiner

SEMICONDUCTOR DEVICE, METHOD FOR CONTROLLING SEMICONDUCTOR DEVICE, AND CONTROL CIRCUIT FOR SEMICONDUCTOR DEVICE

TECHNICAL FIELD

The present invention relates to a semiconductor device, a method for controlling a semiconductor device, and a control circuit for a semiconductor device.

BACKGROUND ART

PTL 1 discloses a semiconductor device in which an insulated gate semiconductor element having two independently controllable insulated gate terminals (hereinafter, referred to as gate terminals) is driven by a single control signal via a delay circuit. Hereinafter, the insulated gate semiconductor element is described as an insulated gate bipolar transistor (IGBT).

PTL 1 discloses the technique as "one control signal is supplied to two gate electrode extraction portions 31 and 32 via a delay circuit including a resistor or a capacitance".

CITATION LIST

Patent Literature

PTL 1: JP-A-2000-101076

SUMMARY OF INVENTION

Technical Problem

However, according to a study by the inventors of the invention, the technique disclosed in PTL 1 has the following problems.

In this semiconductor device, an on-period of an element is different from an on-pulse width of an input pulse and is wider. This semiconductor device has a problem that an IGBT which should originally repeat an ON state/OFF state intermittently is in a continuous ON state depending on an input control signal. Depending on the control signal, there is a problem that the IGBT which should originally be in the ON state once for one on-pulse signal is in the ON state twice for one on-pulse signal.

The invention has been made in view of the above problem, and an object of the invention is to drive a switching element having two gate terminals by one control signal, and to avoid a continuous ON state and an ON state twice for one on-pulse signal.

Solution to Problem

In order to solve the above problem, a semiconductor device of the invention includes: a control signal input terminal; a switching element having a first control terminal and a second control terminal; a first delay unit configured to delay an input signal for a first predetermined time; and a logical product unit configured to calculate a logical product of a first input terminal and a second input terminal. The control signal input terminal is connected to an input terminal of the first delay unit and the second input terminal of the logical product unit. An output terminal of the first delay unit is connected to the first control terminal of the switching element and the first input terminal of the logical product unit. An output terminal of the logical product unit is connected to the second control terminal of the switching element.

Other methods will be described in description of embodiments.

Advantageous Effect

According to the invention, the switching element having two gate terminals can be driven by one control signal, and a continuous ON state and an ON state twice for one on-pulse signal can be avoided.

DESCRIPTION OF EMBODIMENTS

Comparative Example

First, for the purpose of assisting understanding of an object and effect of the invention, a cause of the following problems occurring in a semiconductor device according to a comparative example will be described before a description of embodiments of the invention. That is, there is a problem that an IGBT which should originally repeat an ON state/OFF state intermittently is in a continuous ON state depending on an input control signal. Depending on the input control signal, there is a problem that the IGBT which should originally be in the ON state once for one on-pulse signal is in the ON state twice for one on-pulse signal.

Figure 2:
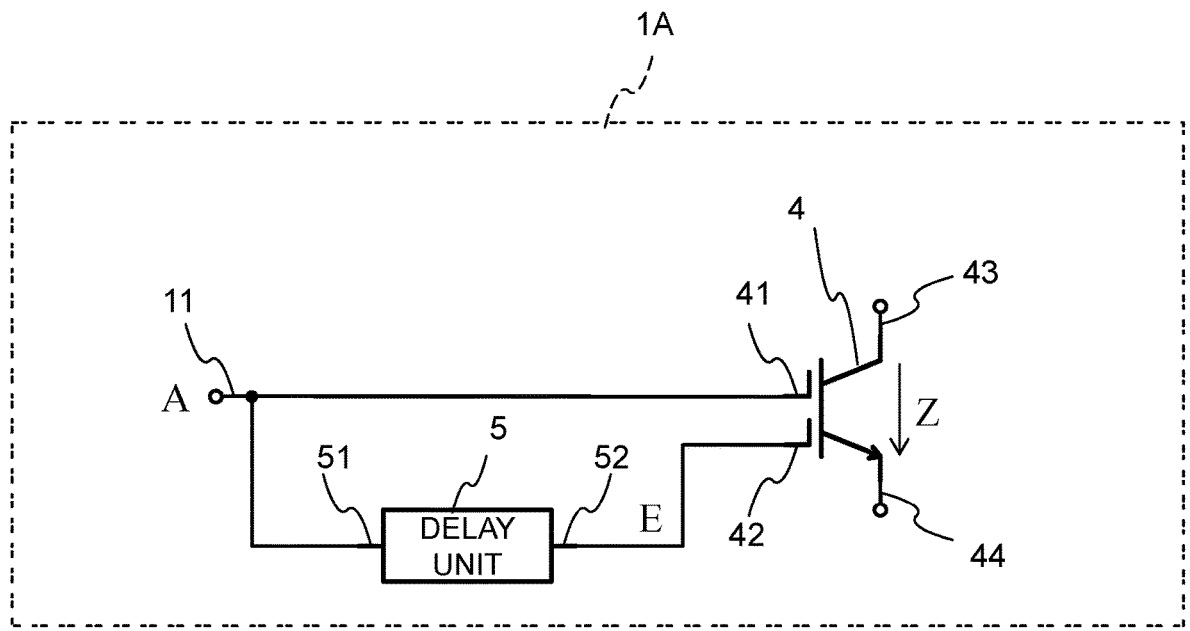
FIG. 2 is a diagram showing a semiconductor device according to a comparative example.

FIG. 2 shows a semiconductor device 1A according to the comparative example. The semiconductor device 1A includes a control signal input terminal 11, an IGBT 4, and a delay unit 5.

The IGBT 4 has a first gate terminal (first control terminal) 41, a second gate terminal (second control terminal) 42, a collector terminal 43, and an emitter terminal 44. A function of the IGBT 4 will be described in detail with reference to FIGS. 3 and 4 described later.

The delay unit (first delay unit) 5 has an input terminal 51 and an output terminal 52. The delay unit 5 has a function of delaying a signal input to the input terminal 51 and to be output from the output terminal 52 for a first predetermined time and outputting the signal, and a delay time is L.

The control signal input terminal 11 is connected to the first gate terminal 41 and the input terminal 51 of the delay unit 5. The output terminal 52 of the delay unit 5 is connected to the second gate terminal 42.

A signal A is a signal input to the control signal input terminal 11. A signal E is a signal output by the delay unit 5 and is delayed from the signal A for the first predetermined time.

Here, an operation of the IGBT 4 having two gate terminals will be described below, but before that, a more general operation of the IGBT having one gate terminal will be described.

Generally, the IGBT has one gate terminal for controlling ON/OFF of the element itself. When an ON signal is input to the gate terminal, a large number of charges are accumulated inside the IGBT, and the IGBT enters a low resistance state, that is, an ON state.

Next, when an OFF signal is input to the gate terminal, a large number of charges accumulated inside the IGBT are quickly discharged, and the IGBT enters a high resistance state, that is, an OFF state. In the IGBT, the accumulated charge is discharged when transitioning (turning off) from the ON state to the OFF state. In this process, the IGBT loses power. This power loss is called turn-off loss. Since the turn-off loss causes a reduction in an efficiency of a power conversion device using the IGBT, it is desirable that the turn-off loss be smaller.

A magnitude of the turn-off loss has a positive correlation with a magnitude of a charge amount accumulated inside the IGBT in the ON state. Therefore, in order to reduce the turn-off loss of the IGBT, it is effective to reduce the accumulated charge amount by adjusting a structure of the element and an amount of impurities introduced. However, the accumulated charge amount in the IGBT is related not only to the turn-off loss but also to a conduction loss.

The conduction loss is a power loss that occurs in the IGBT in the ON state. A magnitude of the conduction loss has a negative correlation with the magnitude of the charge amount accumulated inside the IGBT in the ON state. Therefore, when the accumulated charge amount in the IGBT is reduced, the IGBT has a higher resistance in the ON state, and the conduction loss increases (while the turn-off loss is reduced as described above). From the above description, there is a trade-off relationship between the conduction loss and the turn-off loss of the IGBT.

Next, a configuration and operation of the IGBT 4 having two gate terminals will be described with reference to FIGS. 3 and 4.

Figure 3:
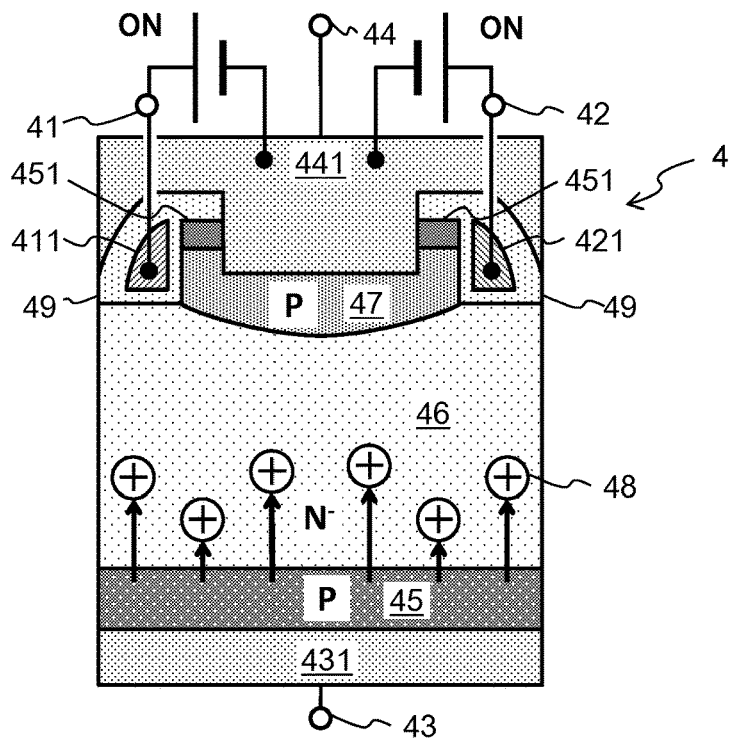
FIG. 3 is a diagram showing a state of a dual gate IGBT in a high injection mode.

FIG. 3 is a diagram showing a state of a dual gate IGBT in a high injection mode.

In the IGBT 4, a P layer 45 and a collector 431 are sequentially formed on one surface of an N− substrate 46. The collector terminal 43 is electrically connected to the collector 431. A P layer 47 is formed in a part of the N− substrate 46. An emitter 441 is formed in a part of the P layer 47. An N+ layer 451 is formed in another region of the P layer 47.

Further, a first gate 411 and a second gate 421 are formed in another region of the N− substrate 46 with gate oxide films interposed therebetween. The first gate terminal 41 is electrically connected to the first gate 411. The second gate terminal 42 is electrically connected to the second gate 421. The first gate 411 is adjacent to one side surface of the P layer 47 and the N+ layer 451 via the gate oxide film 49. The first gate 421 is adjacent to another side surface of the P layer 47 and the N+ layer 451 via the gate oxide film 49.

The emitter 441 is electrically connected to a part of the P layer 47. Further, the emitter 441 is electrically connected to a side surface of the N+ layer 451. The emitter terminal 44 is electrically connected to the emitter 441.

The IGBT 4 has the first gate 411 and the second gate 421 for controlling ON/OFF of the element itself, and is characterized in that the IGBT 4 can be in two ON states, that is, a high injection mode and a low injection mode.

As shown in FIG. 3, when ON signals are input to both the first gate 411 and the second gate 421, the IGBT 4 enters the high injection mode in which many carriers 48 are accumulated.

Figure 4:
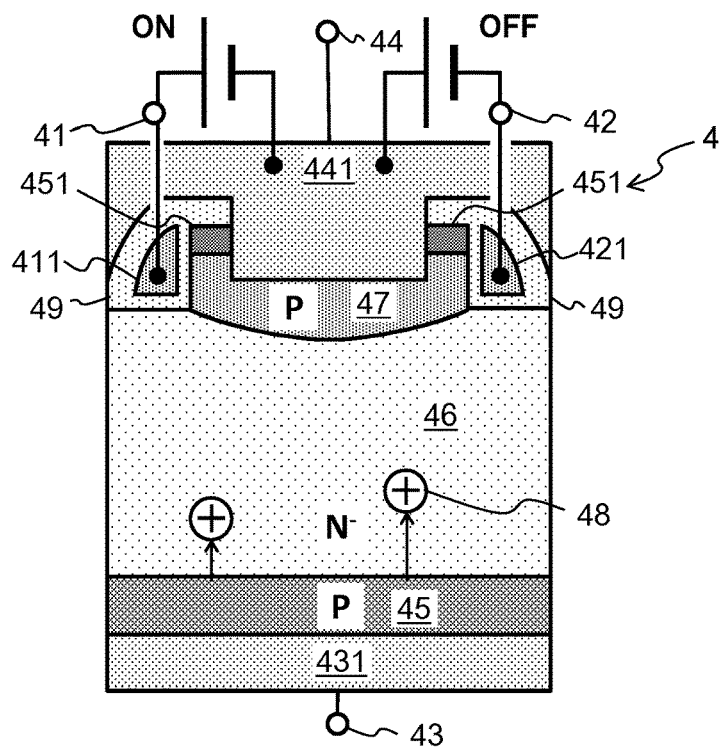
FIG. 4 is a diagram showing a state of the dual gate IGBT in a low injection mode.

On the other hand, as shown in FIG. 4, when an ON signal is input only to the first gate 411 and an OFF signal is input to the second gate 421, the mode becomes the low injection mode.

FIG. 4 is a diagram showing a state of the dual gate IGBT in the low injection mode. This IGBT 4 has a similar configuration as the IGBT 4 shown in FIG. 3.

The accumulated charge amount of the IGBT 4 in the low injection mode shown in FIG. 4 is smaller than the accumulated charge amount in the high injection mode.

Further, when OFF signals are input to both of the two gate terminals, the IGBT 4 enters the OFF state.

When the IGBT 4 having two gate terminals is used, the trade-off relationship between the conduction loss and the turn-off loss of the IGBT 4 can be improved by performing control as follows.

That is, when the IGBT 4 is in the ON state, the IGBT 4 is basically set in the high injection mode, switched to the low injection mode immediately before being turned off, and then is turned off by a controller. The controller can reduce the conduction loss by turning on the IGBT 4 basically in the high injection mode.

Thereafter, before turning off the IGBT 4, the controller switches the IGBT 4 to the low injection mode (while maintaining the ON state), thereby reducing the accumulated charge amount. The controller turns off the IGBT 4 after a certain period of time since the IGBT 4 is switched to the low injection mode for and after the accumulated charge amount is sufficiently reduced, so that the turn-off loss can be reduced. By controlling as described above, the IGBT 4 having two gate terminals improves the trade-off between the conduction loss and the turn-off loss and implements a low-loss operation compared with the IGBT having one gate terminal.

Figure 5:
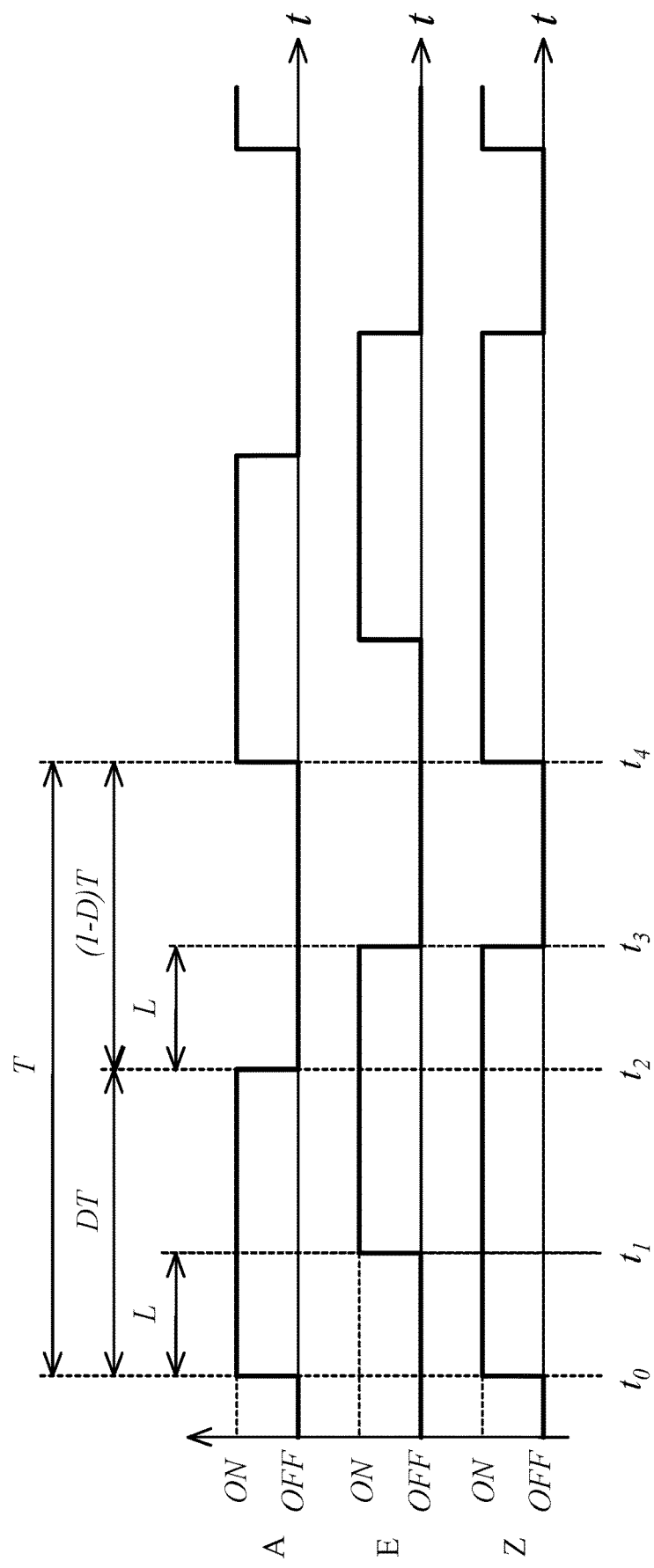
FIG. 5 is a diagram (part 1) showing a state of a waveform of a control signal input to the semiconductor device, a waveform of a signal inside the semiconductor device, and a state according to the comparative example.

FIG. 5 shows a waveform of a control signal input to the semiconductor device 1A, a waveform of a signal inside the semiconductor device 1A, and a state.

The signal A is a pulse signal input to the control signal input terminal 11, and repeats ON and OFF. As shown in FIG. 5, a period from rising of any on-pulse of the signal A to rising of the next on-pulse is defined as a cycle T. A ratio of an on-pulse width in the cycle T is defined as an on-time ratio D. That is, the on-time ratio D can take a value in a range of 0 to 1, and the on-pulse width is represented by DT. An off-pulse width is represented by (1−D)T.

The signal E is a signal output from the output terminal 52 of the delay unit 5. The signal E passes through the delay unit 5, so that the signal E is delayed for the delay time L as compared with the signal A. From a connection relationship shown in FIG. 2, the signal A is applied to the first gate terminal 41, and the signal E is applied to the second gate terminal 42.

A state Z represents the ON and OFF states of the IGBT 4. The IGBT 4 is in the ON state when the ON signal is input to any of the gate terminals. Therefore, the state Z is a logical sum of the signal A and the signal E.

An operation of one cycle of the IGBT 4 will be described in a chronological order from a relationship between the signals A and E and the state Z in FIG. 5.

Before a time point t0, the signals A and E are both at an OFF level, and the first gate terminal 41 and the second gate terminal 42 receive OFF signals. At this time, the IGBT 4 is in the OFF state. At the time point t0, the signal A becomes an ON level and the ON signal is input to the first gate terminal 41, so that the IGBT 4 transitions (turns on) from the OFF state to the ON state. However, since the signal E remains at the OFF level and the OFF signal is input to the second gate terminal 42, the IGBT 4 is turned on in the low injection mode.

When the time L elapses from the time point to, a time point t1 is reached. At this time point t1, the signal E becomes the ON level and the ON signal is input to the second gate terminal 42, so that the IGBT 4 switches to the high injection mode. When a time DT elapses from the time point t0, a time point t2 is reached. At the time point t2, the signal A becomes the OFF level and the OFF signal is input to the first gate terminal 41, so that the IGBT 4 switches to the low injection mode.

When the time L elapses from the time point t2, a time point t3 is reached. At the time point t3, the signal E becomes the OFF level and the OFF signal is input to the second gate terminal 42, so that the IGBT 4 is turned off.

When a time (1−D)T elapses from the time point t2, a time point t4 is reached. The time point t4 is also a time point when a time T elapses from the time point t0. At the time point t4, the signal A becomes the ON level and the ON signal is input to the first gate terminal 41, so that the IGBT 4 is turned on again in the low injection mode and shifts to the next cycle.

According to the operation described above, the IGBT 4 is turned off at the time point t3, but the IGBT 4 is kept in the low injection mode during a period from the time point t2 before this to the time point t3. A length of this period is equal to the delay time L. That is, the IGBT 4 can reduce the turn-off loss by reducing the accumulated charge amount during this period. During the period from the time point t1 to the time point t2, the IGBT 4 is kept in the high injection mode. A length of this period is equal to DT−L. That is, during this period, the conduction loss can be reduced by increasing the accumulated charge amount.

As described above, when the signal A in FIG. 5 is input to the semiconductor device 1A, the IGBT 4 can exhibit the characteristics and achieve the low-loss operation. Since the above operation is achieved only by inputting one control signal to the semiconductor device 1A, as compared with the case where individual control signals are input to the first gate terminal 41 and the second gate terminal 42, there is also an advantage that a control signal generation circuit has a simple configuration.

However, while the on-pulse width of the signal A in FIG. 5 is DT, a turn-on period of the IGBT 4 is (DT+L) as shown by the state Z, which is longer by the delay time L. This can be said to be a problem of the semiconductor device 1A. This is because the on-pulse width DT input to the semiconductor device 1A is determined in order to cause the semiconductor device 1A to exhibit a desired power conversion function. However, since the semiconductor device 1A is turned on over the period (DT+L), there is an error in the expected power conversion function.

During a period from the time point t0 to the time point t1 in FIG. 5, the IGBT 4 enters the low injection mode, which can be said to be a problem of the semiconductor device 1A. The reasons are as follows.

From the state Z in FIG. 5, the IGBT 4 is on during a period from the time point t0 to the time point t3. It is necessary to set the IGBT 4 to the low injection mode during the period from the time point t2 to the time point t3 in order to reduce the turn-off loss of the IGBT 4.

On the other hand, it is desirable to keep the IGBT 4 in the high injection mode during the remaining period from the time point t0 to the time point t2 in order to reduce conduction loss. However, as described above, the IGBT 4 is in the high injection mode only during the period from the time point t1 to the time point t2 of the period from the time point t0 to the time point t2, and is in the low injection mode during the period from the time point t0 to the time point t1. Therefore, from a viewpoint of reducing the conduction loss, the operation of the semiconductor device 1A is not ideal and has a problem.

Although the typical operation of the semiconductor device 1A has been described with reference to FIG. 5, the operation holds for the relationship that the on-pulse width DT is equal to or larger than the delay time L and the off-pulse width (1−D)T is larger than the delay time L shown in FIG. 5. When this condition is organized for D, it is represented by the following Formula 1.

[Math 1]

$$L/T \leq D < 1 - L/T \quad (1)$$

In Formula 1, D: on-time ratio
L: delay time
T: cycle

Next, an operation of the semiconductor device 1A when the off-pulse width (1−D)T is equal to or less than the delay time L will be described. When this condition is organized for D, it is represented by the following Formula 2.

[Math 2]

$$D \geq 1 - L/T \quad (2)$$

Figure 6:
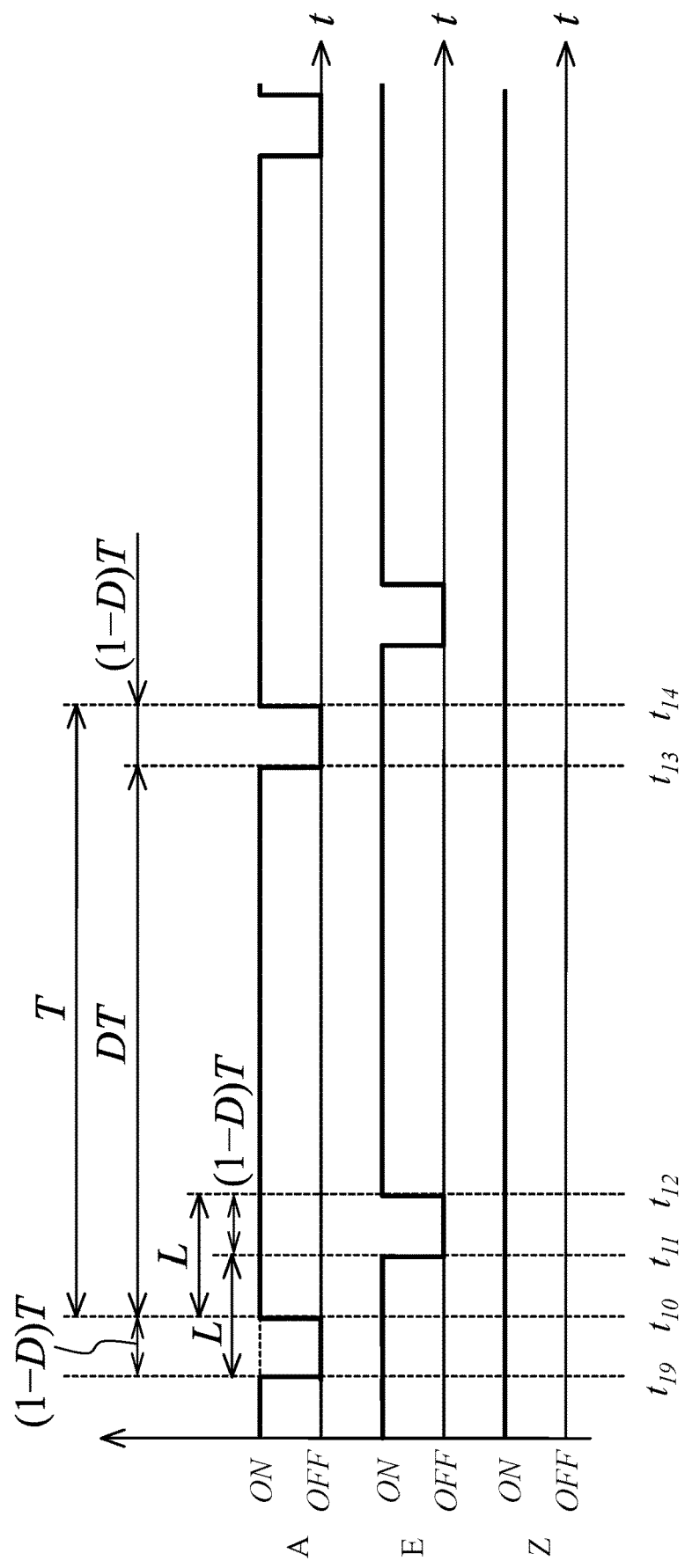
FIG. 6 is a diagram (part 2) showing a waveform of the control signal input to the semiconductor device, a waveform of the signal inside the semiconductor device, and a state according to the comparative example.

FIG. 6 shows an example of a waveform of the control signal input to the semiconductor device 1A, a waveform of the signal inside the semiconductor device 1A, and a state when a relationship represented by Formula 2 is satisfied. The signals A and E and the state Z are the same as those described in FIG. 5.

An operation of one cycle of the IGBT 4 will be described in a chronological order based on the relationship between the signals A and E and the state Z in FIG. 6.

At a time point t19 in a previous cycle, the signal A falls. From the time point t19 to a time point t10, the signal A is at the OFF level, and the OFF signal is input to the first gate terminal 41. The signal E is at the ON level and the ON signal is input to the second gate terminal 42. At this time, the IGBT 4 is in the low injection mode in the ON state.

When the time $(1-D)T$ elapses from the time point t19, the previous cycle ends and a current cycle starts, and the time point t10 is reached. At the time point t10, the signal A becomes the ON level and the ON signal is input to the first gate terminal 41, so that the IGBT 4 switches to the high injection mode.

When the time L elapses from the time point t19, a time point t11 is reached. At the time point t11, the signal E becomes the OFF level and the OFF signal is input to the second gate terminal 42, so that the IGBT 4 switches to the low injection mode.

When the time L elapses from the time point t10, a time point t12 is reached. The time point t12 is also a time point when the time $(1-D)T$ elapses from the time point t11. At this time point t12, the signal E becomes the ON level and the ON signal is input to the second gate terminal 42, so that the IGBT 4 switches to the high injection mode.

When the time DT elapses from the time point t10, a time point t13 is reached. At the time point t13, the signal A becomes the OFF level and the OFF signal is input to the first gate terminal 41, so that the IGBT 4 switches to the low injection mode. The time point t13 in the current cycle is a time point corresponding to the time point t19 in the previous cycle.

When the time $(1-D)T$ elapses from the time point t13, a time point t14 is reached. The time point t14 is also a time point when the time T elapses from the time point t10. At the time point t14, the signal A becomes the ON level and the ON signal is input to the first gate terminal 41, so that the IGBT 4 switches again to the high injection mode and shifts to the next cycle. Accordingly, the IGBT 4 having two gate terminals can be driven by one control signal.

According to the operation described above, although the IGBT 4 switches between the high injection mode and the low injection mode, as shown in the state Z, the IGBT 4 keeps the ON state over one cycle (from the time point t10 to the time point t14). That is, the IGBT 4 should originally repeat the ON state/OFF state intermittently according to the signal A input as the control signal. However, the IGBT 4 is actually in the continuous ON state. This can be said to be a problem of the semiconductor device 1A.

Next, an operation of the semiconductor device 1A when the on-pulse width DT is less than the delay time L will be described. When this condition is organized for D, it is represented by the following Formula 3.

[Math 3]

$$D < L/T \qquad (3)$$

In Formula 3, D: on-time ratio
L: delay time
T: cycle

Figure 7:
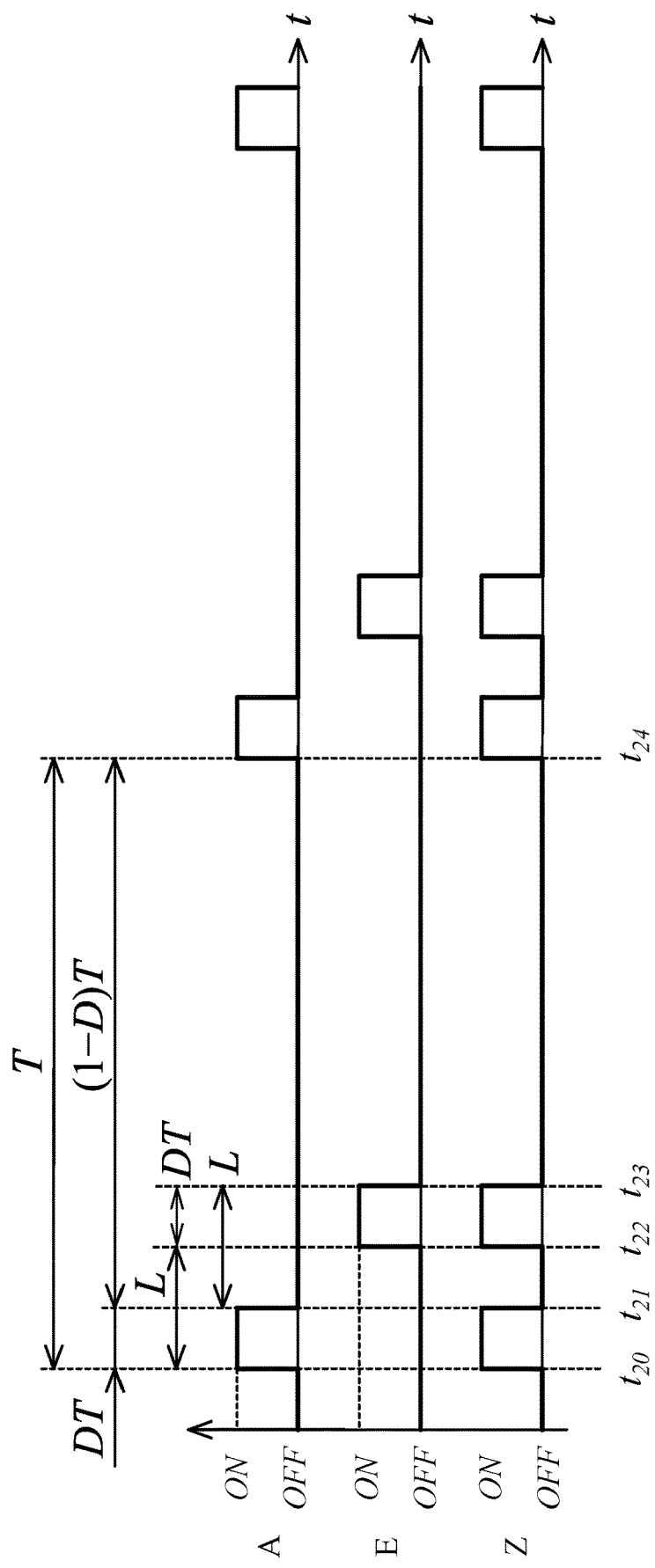
FIG. 7 is a diagram (part 3) showing a waveform of the control signal input to the semiconductor device, a waveform of the signal inside the semiconductor device, and a state according to the comparative example.

FIG. 7 shows a waveform of the control signal input to the semiconductor device 1A and a waveform of the signal inside the semiconductor device 1A, and a state when a relationship represented by Formula 3 is satisfied. The signals A and E and the state Z are the same as those described in FIG. 5.

An operation of one cycle of the IGBT 4 will be described in a chronological order based on the relationship between the signals A and E and the state Z in FIG. 7.

Immediately before a time point t20, the signals A and E are both at the OFF level, and OFF signals are input to the first gate terminal 41 and the second gate terminal 42. At this time, the IGBT 4 is in the OFF state.

At the time point t20, the signal A becomes the ON level and the ON signal is input to the first gate terminal 41, so that the IGBT 4 is turned on in the low injection mode. When the time DT elapses from the time point t20, a time point t21 is reached. At the time point t21, the signal E becomes the OFF level and the OFF signal is input to the first gate terminal 41, so that the IGBT 4 is turned off.

When the time L elapses from the time point t20, a time point t22 is reached. At the time point t22, the signal E becomes the ON level and the ON signal is input to the second gate terminal 42, so that the IGBT 4 is turned on in the low injection mode.

When the time DT elapses from the time point t22, a time point t23 is reached. The time point t23 is also a time point when the time L elapses from the time point t21. At the time point t23, the signal A becomes the OFF level and the OFF signal is input to the second gate terminal 42, so that the IGBT 4 is turned off again.

When the time $(1-D)T$ elapses from the time point t21, a time point t24 is reached. The time point t24 is also a time point when the time T elapses from the time point t20. At the time point t24, the signal A becomes the ON level and the ON signal is input to the first gate terminal 41, so that the IGBT 4 is turned on again in the low injection mode and shifts to the next cycle. Accordingly, the IGBT 4 having two gate terminals can be driven by one control signal.

According to the operation described above, the control signal input as the signal A becomes the on-pulse only once during a period from the time point t20 to the time point t21 in one cycle. On the other hand, as shown in the state Z, the IGBT 4 is in the ON state during the period from the time point t20 to the time point t21, and in the ON state again during a period from the time point t22 to the time point t23. That is, the IGBT 4 should originally be in the ON state once for one on-pulse signal, but is actually in the ON state twice for one on-pulse signal. This can be said to be a problem of the semiconductor device 1A.

Hereinafter, embodiments for carrying out the invention will be described with reference to the drawings as appropriate.

First Embodiment

A first embodiment of the invention will be described below with reference to FIGS. 1, 8, 9, and 10.

Figure 1:
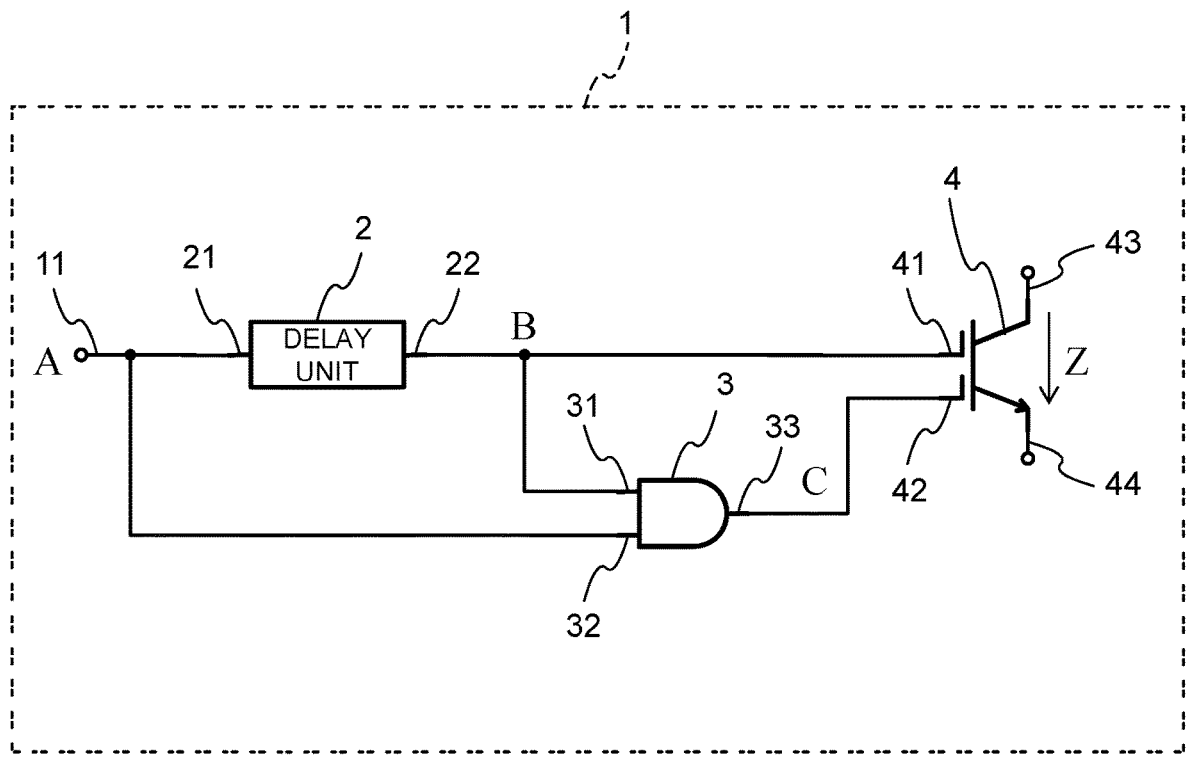
FIG. 1 is a diagram showing a semiconductor device according to a first embodiment.

FIG. 1 shows a semiconductor device 1 according to the first embodiment of the invention.

The semiconductor device 1 includes the control signal input terminal 11, the IGBT 4, a delay unit 2, and a logical product unit 3.

The IGBT 4 has the first gate terminal 41, the second gate terminal 42, the collector terminal 43, and the emitter terminal 44. The function of the IGBT 4 will be described with reference to FIGS. 3 and 4.

The delay unit 2 has an input terminal 21 and an output terminal 22. The delay unit 2 has a function of delaying a signal input to the input terminal 21 for a first predetermined time and then outputting the signal from the output terminal 22, and the delay time is L.

The logical product unit 3 has a first input terminal 31, a second input terminal 32, and an output terminal 33. The logical product unit 3 has a function of calculating a logical product of the signals input to the first input terminal 31 and the second input terminal 32 and outputting the logical product from the output terminal 33.

The control signal input terminal 11 is connected to the input terminal 21 of the delay unit 2 and the second input terminal 32 of the logical product unit 3. The output terminal 22 of the delay unit 2 is connected to the first gate terminal 41 of the IGBT 4 and the first input terminal 31 of the logical product unit 3. The output terminal 33 of the logical product unit 3 is connected to the second gate terminal 42 of the IGBT 4.

The signal A is a signal input to the control signal input terminal 11. A signal B is a signal output by the delay unit 2 and is delayed from the signal A for the first predetermined time. A signal C is a signal output from the logical product unit 3, and is a logical product of the signal A and the signal B.

Figure 8:
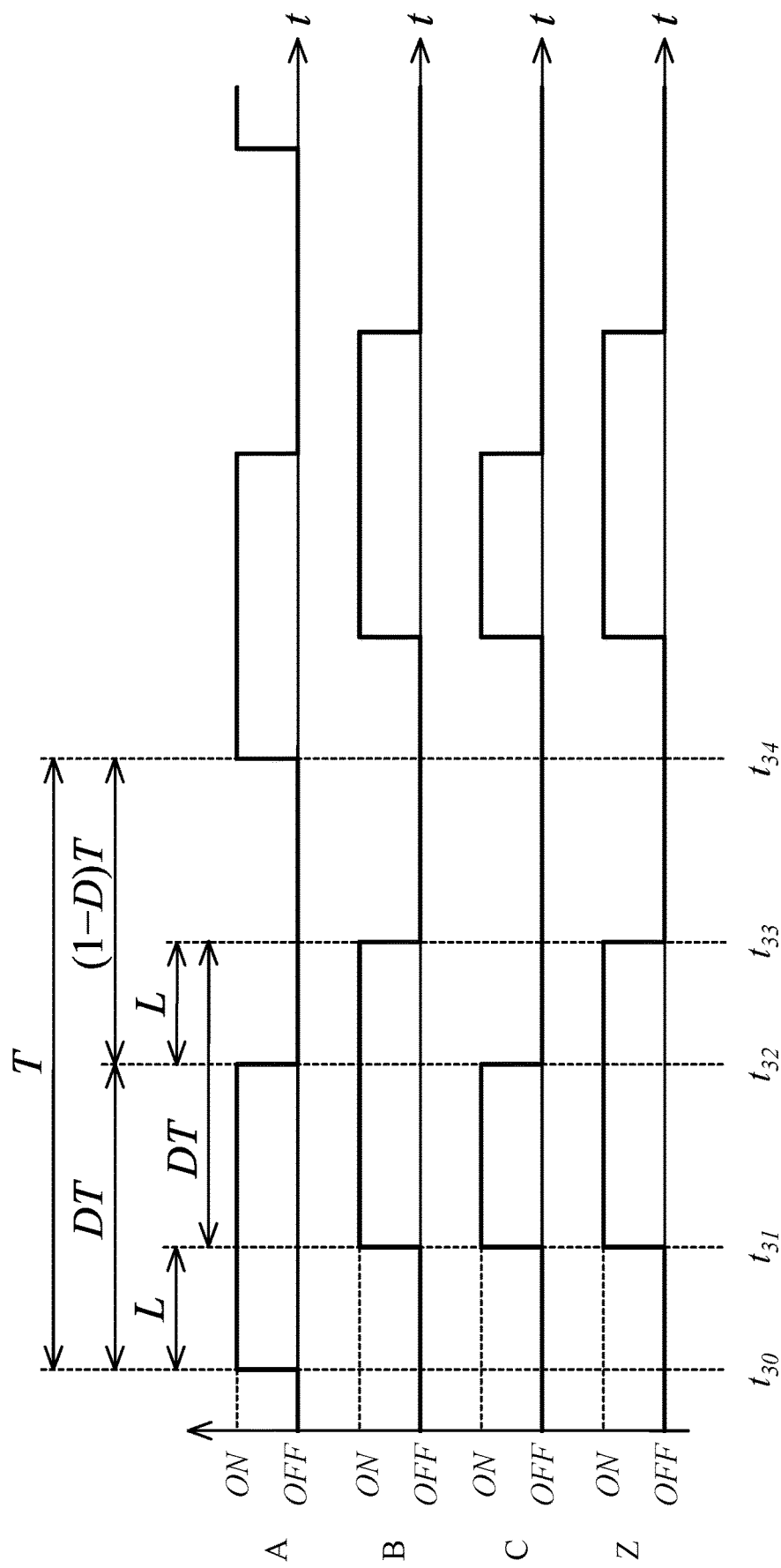
FIG. 8 is a diagram (part 1) showing a waveform of a control signal input to the semiconductor device, waveforms of signals inside the semiconductor device, and a state according to the first embodiment.

FIG. 8 shows an example a waveform of a control signal input to the semiconductor device 1 and waveforms of signals inside the semiconductor device 1.

The signal A is a pulse signal input to the control signal input terminal 11, and repeats ON and OFF. As shown in FIG. 8, a period from rising of any on-pulse of the signal A to rising of the next on-pulse is defined as a cycle T. A ratio of an on-pulse width in the cycle T is defined as an on-time ratio D. That is, the on-time ratio D can take a value in the range of 0 to 1. The on-pulse width is represented by DT. An off-pulse width is represented by (1−D)T.

The signal B is a signal output from the output terminal 22 of the delay unit 2. The signal B passes through the delay unit 2, so that the signal B is delayed for the delay time L as compared with the signal A.

The signal C is a signal output from the output terminal 33 of the logical product unit 3. From a connection relationship shown in FIG. 1, the signal C is the logical product of the signal A and the signal B.

In the IGBT 4, the signal B is input to the first gate terminal 41, and the signal C is input to the second gate terminal 42.

A state Z represents the ON and OFF states of the IGBT 4. The IGBT 4 is in the ON state when the ON signal is input to any of the gate terminals. Therefore, the state Z is a logical sum of the signal B and the signal C.

An operation of one cycle of the IGBT 4 will be described in a chronological order based on the relationship between the signals A, B, and C and the state Z in FIG. 8.

However, immediately before a time point t30, the signals B and C are at the OFF level and the OFF signals are input to the first gate terminal 41 and the second gate terminal 42, so that the IGBT 4 is in the OFF state. At the time point t30, the signal A rises, but the signals B and C remain at the OFF level, the OFF signals are input to the first gate terminal 41 and the second gate terminal 42, so that the IGBT 4 continues the OFF state.

When the time L elapses from the time point t30, a time point t31 is reached. At the time point t31, the signals B and C become the ON level and the ON signals are input to the first gate terminal 41 and the second gate terminal 42, so that the IGBT 4 is turned on in the high injection mode.

When the time DT elapses from the time point t30, a time point t32 is reached. At the time point t32, the signal C becomes the OFF level and the OFF signal is input to the second gate terminal 42, so that the IGBT 4 switches to the low injection mode.

When the time L elapses from the time point t32, a time point t33 is reached. The time point t33 is also a time point when the time DT elapses from the time point t31. At the time point t33, the signal B becomes the OFF level and the OFF signal is input to the first gate terminal 41, so that the IGBT 4 is turned off.

When the time (1−D)T elapses from the time point t32, a time point t34 is reached. The time point t34 is also a time point when the time T elapses from the time point t30. At the time point t34, the signal A rises again and shifts to the next cycle.

According to the operation described above, the IGBT 4 is turned off at the time point t33, and the IGBT 4 is kept in the low injection mode during a period from the time point t32 to the time point t33. A length of this period is equal to the delay time L. That is, since the IGBT 4 reduces the accumulated charge amount during this period, the turn-off loss can be reduced.

During a period from the time point t31 to the time point t32, the IGBT 4 is kept in the high injection mode. A length of this period is equal to DT−L. That is, since the accumulated charge amount in the IGBT 4 is increased during this period, the conduction loss can be reduced.

As described above, when the control signal shown by the signal A in FIG. 8 is input to the semiconductor device 1, the IGBT 4 can exhibit the characteristics and achieve the low-loss operation. Since the above operation is achieved only by inputting one control signal to the semiconductor device 1, as compared with the case where individual control signals are input to the first gate terminal 41 and the second gate terminal 42, there is also an advantage that a control signal generation circuit has a simple configuration.

In FIG. 8, the period DT which is in the ON state of the state Z is the same as the on-pulse width DT of the signal A. That is, if an on-pulse signal having the width DT is input to the semiconductor device 1, the semiconductor device 1 is turned on over the period DT. Therefore, the semiconductor device 1 can solve the problem shown in FIG. 5 that occurs in the semiconductor device 1A according to the comparative example, and can cause the semiconductor device 1 to exhibit a desired power conversion function.

From the state Z in FIG. 8, the IGBT 4 is on during a period from the time point t31 to the time point t33. It is necessary to switch the IGBT 4 to the low injection mode during the period from the time point t32 to the time point t33 in order to reduce the turn-off loss of the IGBT 4. On the other hand, during the remaining period from the time point t31 to the time point t32, the IGBT 4 is in the high injection mode. Therefore, the semiconductor device 1 can achieve an ideal operation from the viewpoint of reducing conduction loss, and can solve the problem shown in FIG. 5 that occurs in the semiconductor device 1A according to the comparative example.

Although the typical operation of the semiconductor device 1 has been described with reference to FIG. 8, the operation holds for the relationship that the on-pulse width DT is equal to or larger than the delay time L and the off-pulse width (1−D)T is larger than the delay time L shown in FIG. 8. When this condition is organized for D, it is represented by the following Formula 4. This Formula 4 is the same as the above Formula 1.

[Math 4]

$$L/T \leq D < 1 - L/T \quad (4)$$

In Formula 4, D: on-time ratio
L: delay time
T: cycle

Next, an operation of the semiconductor device 1 when the off-pulse width (1−D)T is equal to or less than the delay time L will be described. When this condition is organized for D, it is represented by the following Formula 5. This Formula 5 is the same as the above Formula 2.

[Math 5]

$$D \geq 1 - L/T \quad (5)$$

Figure 9:
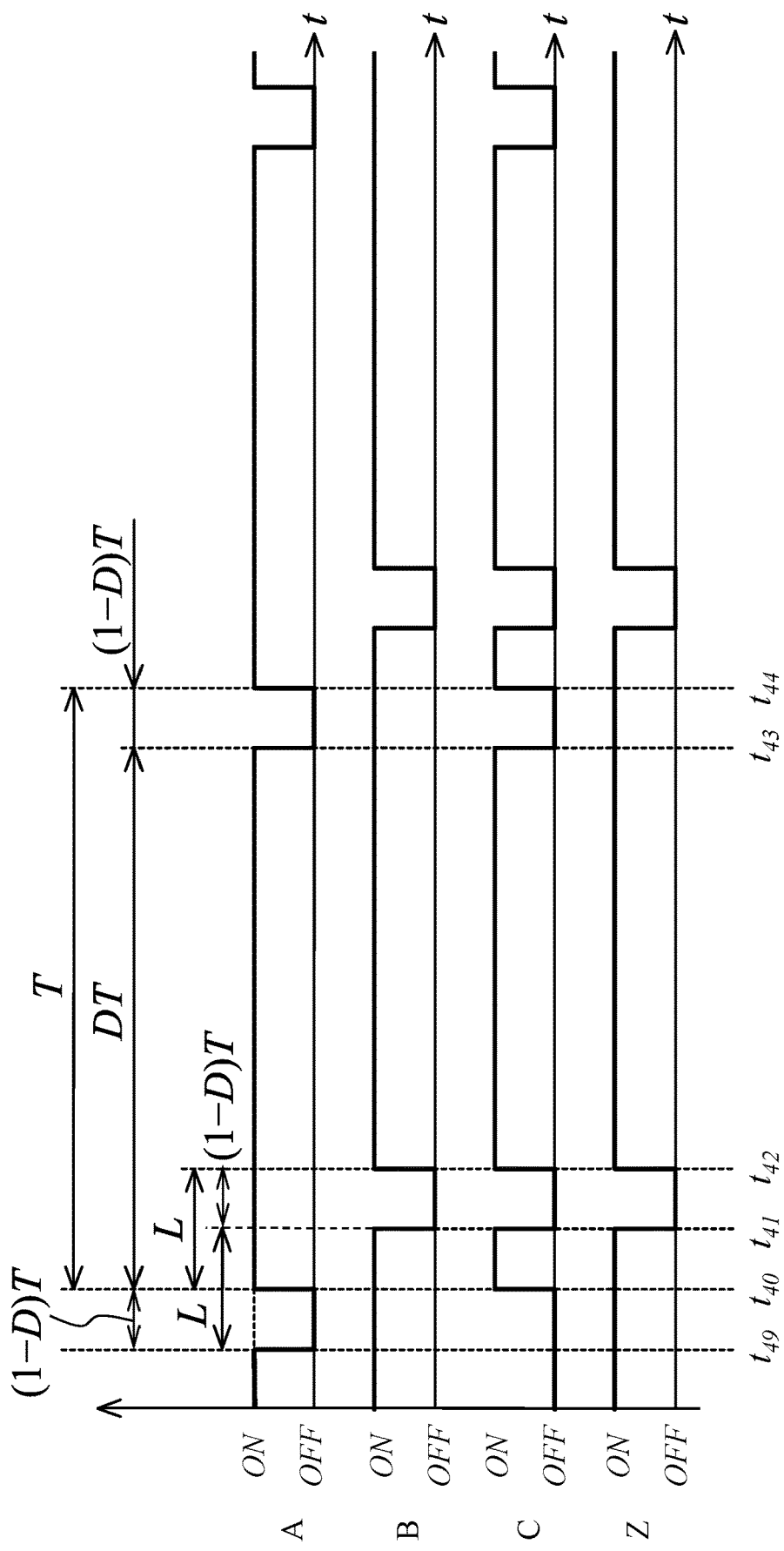
FIG. 9 is a diagram (part 2) showing a waveform of the control signal input to the semiconductor device, waveforms of the signals inside the semiconductor device, and a state according to the first embodiment.

FIG. 9 shows a waveform of the control signal input to the semiconductor device 1, waveforms of the signals inside the semiconductor device 1, and a state when a relationship represented by Formula 5 is satisfied. The signals A, B, and C and the state Z are the same as those described in FIG. 8.

An operation of one cycle of the IGBT 4 will be described in a chronological order based on the relationship between the signals A, B, and C and the state Z in FIG. 9.

At a time point t49 in a previous cycle, the signal A falls. From the time point t49 to a time point t40, the signal B is at the ON level, and the ON signal is input to the first gate terminal 41. The signal C is at the OFF level, and the OFF signal is input to the second gate terminal 42. Therefore, the IGBT 4 is in the low injection mode in the ON state.

When the time (1−D)T elapses from the time point t49, the previous cycle ends and a current cycle starts, and the time point t40 is reached. At this time point t40, the signal C becomes the ON level and the ON signal is input to the second gate terminal 42, so that the IGBT 4 switches to the high injection mode.

When the time L elapses from the time point t49, a time point t41 is reached. At the time point t41, the signals B and C become the OFF level and OFF signals are input to the first gate terminal 41 and the second gate terminal 42, so that the IGBT 4 is turned off.

When the time L elapses from the time point t40, a time point t42 is reached. The time point t42 is also a time point when the time (1−D)T elapses from the time point t41. At the time point t42, the signals B and C become the ON level and the ON signals are input to the first gate terminal 41 and the second gate terminal 42, so that the IGBT 4 is turned on in the high injection mode.

When the time DT elapses from the time point t40, a time point t43 is reached. At the time point t43, the signal C becomes the OFF level and the OFF signal is input to the second gate terminal 42, so that the IGBT 4 switches to the low injection mode. The time point t43 in the current cycle is a time point corresponding to the time point t49 in the previous cycle.

When the time (1−D)T elapses from the time point t43, a time point t44 is reached. The time point t44 is also a time point when the time T elapses from the time point t40. At the time point t44, the signal C becomes the ON level and the ON signal is input to the second gate terminal 42, so that the IGBT 4 switches again to the high injection mode and shifts to the next cycle.

According to the operation described above, as shown in the signal A and the state Z, the IGBT 4 intermittently repeats the ON state and the OFF state according to the single signal A input as the control signal. Therefore, since the semiconductor device 1 can be prevented from being in the continuous ON state, the semiconductor device 1 can solve the problem shown in FIG. 6 that occurs in the semiconductor device 1A according to the comparative example.

Next, an operation of the semiconductor device 1 when the on-pulse width DT is less than the delay time L will be described. When this condition is organized for D, it is represented by the following Formula 6. This Formula 6 is the same as the above Formula 3.

[Math 6]

$$D < L/T \quad (6)$$

In Formula 6, D: on-time ratio
L: delay time
T: cycle

Figure 10:
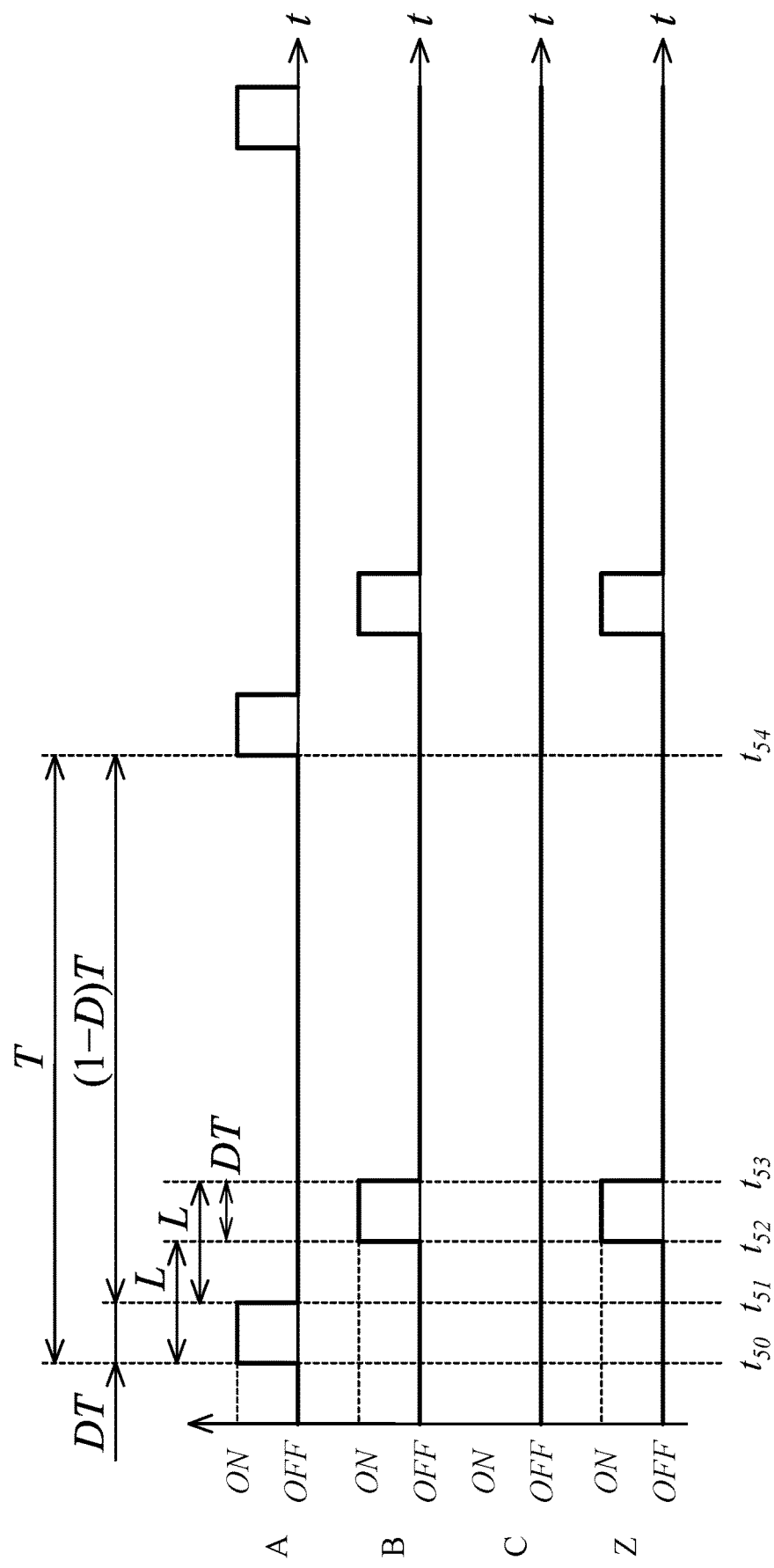
FIG. 10 is a diagram (part 3) showing a waveform of the control signal input to the semiconductor device, waveforms of the signals inside the semiconductor device according to the first embodiment.

FIG. 10 shows a waveform of the control signal input to the semiconductor device 1, waveforms of the signals inside the semiconductor device 1, and a state when a relationship represented by Formula 6 is satisfied. The signals A, B, and C and the state Z are the same as those described in FIG. 8.

An operation of one cycle of the IGBT 4 will be described in a chronological order based on the relationship between the signals A, B, and C and the state Z in FIG. 10.

Immediately before a time point t50, the signals B and C are both at the OFF level, and OFF signals are input to the first gate terminal 41 and the second gate terminal 42. Therefore, the IGBT 4 is in the OFF state. At the time point t50, the signal A rises to the ON level, but the signals B and C maintain the OFF level. At this time, the OFF signals are input to the first gate terminal 41 and the second gate terminal 42, so that the IGBT 4 continues the OFF state.

When the time DT elapses from the time point t50, a time point t51 is reached. At the time point t51, the signal A falls and becomes the OFF level, and the signals B and C maintain the OFF level. At this time, the OFF signals are input to the first gate terminal 41 and the second gate terminal 42, so that the IGBT 4 continues the OFF state.

When the time L elapses from the time point t50, a time point t52 is reached. At the time point t52, the signal B becomes the ON level and the ON signal is input to the first gate terminal 41, so that the IGBT 4 is turned on in the low injection mode.

When the time DT elapses from the time point t52, a time point t53 is reached. The time point t53 is also a time point when the time L elapses from the time point t51. At the time point t53, the signal B becomes the OFF level and the OFF signal is input to the first gate terminal 41, so that the IGBT 4 is turned off.

When the time (1−D)T elapses from the time point t51, a time point t54 is reached. The time point t54 is also a time point when the time T elapses from the time point t50. When the signal A rises again to the ON level at the time point t54, the signal A shifts to the next cycle.

According to the operation described above, the control signal input as the signal A is turned on once during a period from the time point t50 to the time point t51 in one cycle. On the other hand, as shown in the state Z, the IGBT 4 is turned on once during a period from the time point t52 to the time point t53. That is, the IGBT 4 is in the ON state once for one on-pulse signal. Therefore, since the semiconductor device 1 can be prevented from being in the ON state twice for one on-pulse signal, the semiconductor device 1 can solve the problem shown in FIG. 7 that occurs in the semiconductor device 1A according to the comparative example.

According to the operation described above, since the IGBT 4 does not enter the high injection mode, there is a concern that conduction loss may increase. However, since the on-pulse width DT is less than the delay time L and short, an increase in conduction loss is limited and can be ignored according to a study by the inventor.

As described above, the first embodiment of the invention has shown that the problems shown in FIGS. 5 to 7 that occur in the semiconductor device 1A according to the comparative example can be solved. However, the first embodiment of the invention has another problem as described below. That is, as shown in FIG. 9, when it is represented by the relationship of Formula 5, the IGBT 4 is turned off at the time point t41. However, since the IGBT 4 is in the high injection mode during the period from the time point t40 to the time point t41 immediately before the time point t41, there is a concern that the turn-off loss may be increased. Solutions for solving this will be described in another embodiment.

Second Embodiment

A second embodiment of the invention will be described below with reference to FIGS. 1, and 11 to 13.

Figure 11:
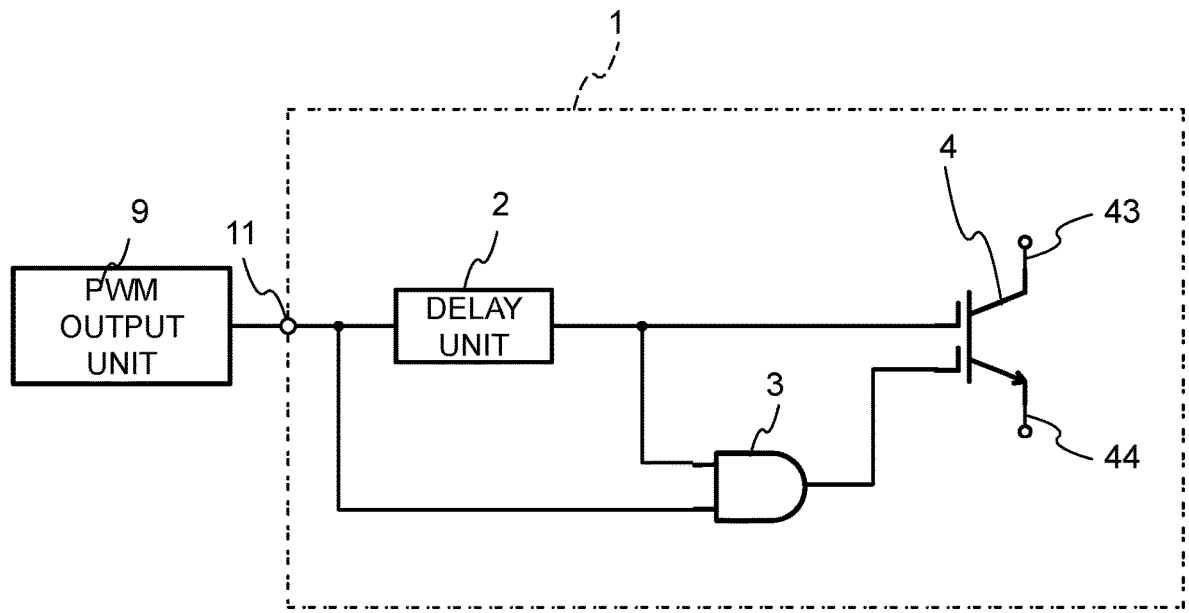
FIG. 11 is a diagram showing a semiconductor device and a PWM output unit according to a second embodiment.

FIG. 11 is a diagram showing a semiconductor device and a pulse width modulation (PWM) output unit according to the second embodiment.

The semiconductor device 1 has a similar configuration as the semiconductor device 1 shown in FIG. 1.

A PWM output unit 9 generates a pulse-shaped PWM control signal and inputs the generated signal to the control signal input terminal 11, and is implemented by, for example, a microcomputer. The PWM output unit 9 controls the semiconductor device 1 by executing PWM output processing shown in FIG. 12. The definition of the cycle T, the on-time ratio D, and the delay time L is similar to that in the first embodiment.

However, the present embodiment is different from the first embodiment in that the control signal input to the control signal input terminal 11 is limited as follows. That is, the off-pulse width (1−D)T is larger than the delay time L. When this condition is organized for D, it is set as D<1−L/T.

Figure 12:
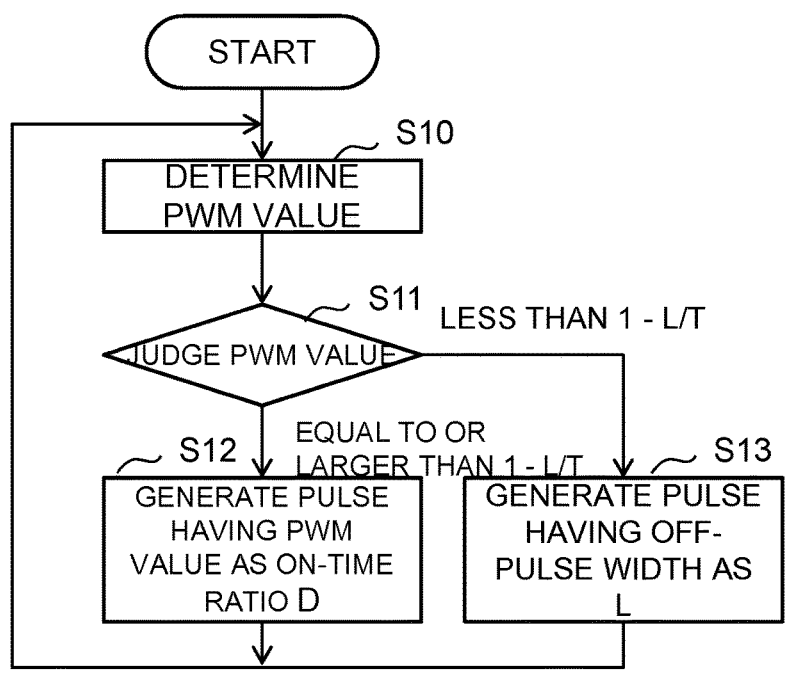
FIG. 12 is a flowchart showing PWM output processing.

FIG. 12 is a flowchart showing the PWM output processing.

When the processing is started, the PWM output unit 9 determines a PWM value (step S10), and judges this PWM value (step S11). If the PWM value is equal to or larger than 1−L/T, the PWM output unit 9 generates a pulse having the PWM value as the on-time ratio D (step S12), and the processing returns to step S10.

If the PWM value is less than 1−L/T, the PWM output unit 9 generates a pulse having an off-pulse width as L (step S13), and the processing returns to step S10.

Figure 13:
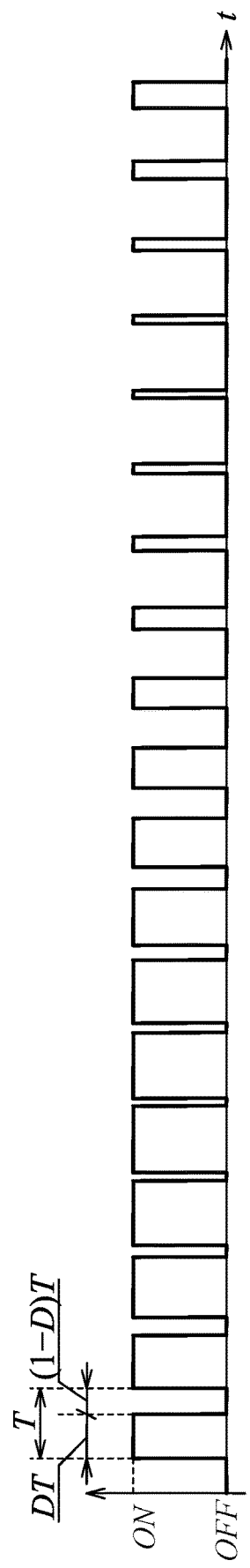
FIG. 13 is a diagram showing a waveform of a control signal input to the semiconductor device according to the second embodiment.

FIG. 13 shows an example of a control signal input to the control signal input terminal 11 according to the present embodiment. As shown in FIG. 13, the on-time ratio D of the control signal changes every moment according to the power conversion function to be achieved by the semiconductor device 1. That is, the on-time ratio D (usually) can take a value in the range of 0 to 1 and changes, and the off-pulse width (1−D)T is not constant.

The PWM output unit 9 according to the present embodiment limits the control signal such that the on-time ratio D satisfies D<1−L/T, and makes the off-pulse width (1−D)T larger than the delay time L.

By providing a limitation on the control signal in this way, when the relationship of Formula 2 or Formula 5 is satisfied, it is possible to solve the problem that there is a concern that the turn-off loss occurring in the first embodiment of the invention is increased. This is because, in the present embodiment, there is no relationship of Formula 2 or Formula 5.

Third Embodiment

A third embodiment of the invention will be described below with reference to FIGS. 14 and 15.

Figure 14:
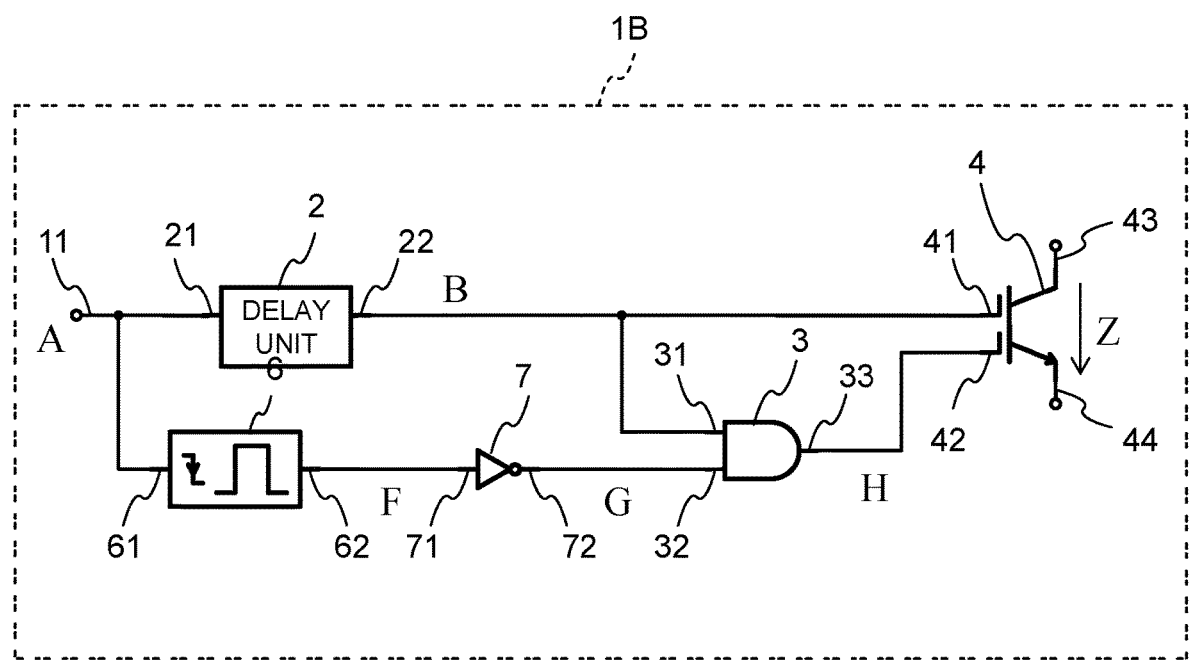
FIG. 14 is a diagram showing a semiconductor device according to a third embodiment.

FIG. 14 shows a semiconductor device 1B according to the third embodiment of the invention.

The semiconductor device 1B includes the control signal input terminal 11, the IGBT 4, the delay unit 2, the logical product unit 3, a one-shot pulse generation unit 6 of a falling edge trigger type, and a logical negative unit 7.

The IGBT 4 includes the first gate terminal 41, the second gate terminal 42, the collector terminal 43, and the emitter terminal 44.

The delay unit 2 has the input terminal 21 and the output terminal 22. The delay unit 2 has a function of delaying a signal input to the input terminal 21 for a first predetermined time and then outputting the signal from the output terminal 22, and the delay time is L.

The one-shot pulse generation unit 6 is of a falling edge trigger type, and has an input terminal 61 and an output terminal 62. The one-shot pulse generation unit 6 has a function of immediately outputting a pulse signal having a certain time width once from the output terminal 62 when a signal input to the input terminal 61 falls (switches from ON to OFF), and defines the time width as M.

The logical negative unit 7 has an input terminal 71 and an output terminal 72. The logical negative unit 7 has a function of calculating a logical negative of a signal input to the input terminal 71 and outputting the negative value from the output terminal 72.

The logical product unit 3 has the first input terminal 31, the second input terminal 32, and the output terminal 33. The logical product unit 3 has a function of calculating a logical product of the signals input to the first input terminal 31 and the second input terminal 32 and outputting the logical product from the output terminal 33.

The control signal input terminal 11 is connected to the input terminal 21 of the delay unit 2 and the input terminal 61 of the one-shot pulse generation unit 6. The output terminal 22 of the delay unit 2 is connected to the first gate terminal 41 of the IGBT 4 and the first input terminal 31 of the logical product unit 3.

The output terminal 62 of the one-shot pulse generation unit 6 is connected to the input terminal 71 of the logical negative unit 7. The output terminal 72 of the logical negative unit 7 is connected to the second input terminal 32 of the logical product unit 3. The output terminal 33 of the logical product unit 3 is connected to the second gate terminal 42 of the IGBT 4. That is, the one-shot pulse generation unit 6 and the logical negative unit 7 are connected in series and inserted between the control signal input terminal 11 and the second input terminal 32 of the logical product unit 3.

The signal A is a signal input to the control signal input terminal 11. The signal B is a signal output by the delay unit 2 and is delayed from the signal A for the first predetermined time. A signal F is a signal output by the one-shot pulse generation unit 6. A signal G is a signal output by the logical negative unit 7, and is an inverse signal of the signal F. A signal H is a signal output from the logical product unit 3, and is a logical product of the signal B and the signal G.

Figure 15:
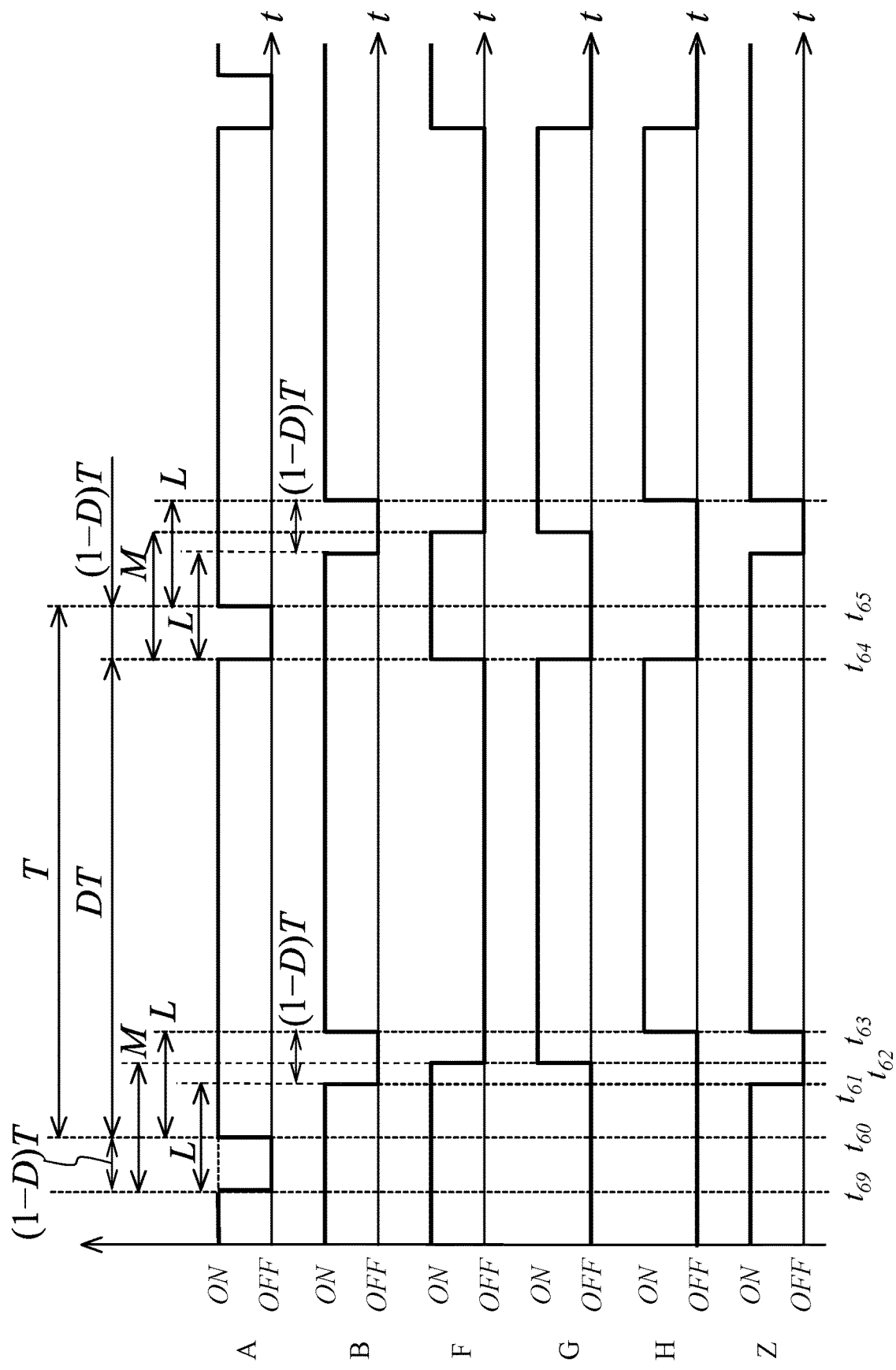
FIG. 15 is a diagram showing a waveform of a control signal input to the semiconductor device, waveforms of signals inside the semiconductor device, and a state according to the third embodiment.

FIG. 15 shows a waveform of a control signal input to the semiconductor device 1B, waveforms of signals inside the semiconductor device 1B, and a state.

The signal A is a pulse signal input to the control signal input terminal 11, and repeats ON and OFF. As shown in FIG. 15, a period from rising of any on-pulse of the signal A to rising of the next on-pulse is defined as the cycle T. A ratio of an on-pulse width in the cycle T is defined as an on-time ratio D. That is, the on-time ratio D can take a value in the range of 0 to 1. The on-pulse width is represented by DT. An off-pulse width is represented by (1−D)T. The operation holds for the relationship that the off-pulse width (1−D)T is equal to or less than the delay time L shown in FIG. 15. When this condition is organized for D, it is represented by the following Formula 7.

[Math 7]

$$D \geq 1 - L/T \qquad (7)$$

In Formula 7, D: on-time ratio
L: delay time
T: cycle

In FIG. 15, the time width M is equal to or larger than the delay time L, and is less than a sum of the delay time L and the off-pulse width (1−D)T, that is, less than L+(1−D)T. When this condition is organized for M, it is represented by the following Formula 8.

[Math 8]

$$L \leq M < L + (1-D)T \qquad (8)$$

In Formula 8, M: time width
L: delay time
T: cycle

The signal B is a signal output from the output terminal 22 of the delay unit 2. The signal B passes through the delay unit 2, so that the signal B is delayed for the delay time L as compared with the signal A.

The signal F is a signal output from the output terminal 62 of the one-shot pulse generation unit 6. From a connection relationship shown in FIG. 14, the signal F rises in synchronization with a falling edge of the signal A, and outputs a pulse signal with the time width M once.

The signal G is a signal output from the output terminal of the logical negative unit 7. From the connection relationship shown in FIG. 14, the signal G is a logical negative of the signal F.

The signal H is a signal output from the output terminal 33 of the logical product unit 3. From the connection relationship shown in FIG. 14, the signal H is the logical product of the signal B and the signal G.

In the IGBT 4, the signal B is input to the first gate terminal 41, and the signal H is input to the second gate terminal 42.

A state Z represents the ON and OFF states of the IGBT 4. The IGBT 4 is in the ON state when the ON signal is input to any of the gate terminals. Therefore, the state Z is a logical sum of the signal B and the signal H.

An operation of one cycle of the IGBT 4 will be described in a chronological order based on a relationship between the signals A, B, F, G, and H and the state Z in FIG. 15.

At a time point t69 in a previous cycle, the signal A falls. From the time point t69 to a time point t60, the signal B is at the ON level, and the ON signal is input to the first gate terminal 41. The signal H is at the OFF level, and the OFF signal is input to the second gate terminal 42. Therefore, the IGBT 4 is in the low injection mode in the ON state.

When the time (1−D)T elapses from the time point t69, the previous cycle ends and a current cycle starts, and the time point t60 is reached. At the time point t60, the signal A rises. The signal B is at the ON level, and the ON signal is input to the first gate terminal 41. The signal H is at the OFF level, and the OFF signal is input to the second gate terminal 42. Therefore, the IGBT 4 continues the low injection mode in the ON state.

When the time L elapses from the time point t69, a time point t61 is reached. At the time point t61, the signal B becomes the OFF level and the OFF signal is input to the first gate terminal 41, so that the IGBT 4 is turned off.

When the time M elapses from the time point t69, a time point t62 is reached. At the time point t62, the signal F falls and the signal G rises. The signals B and H maintain the OFF level and the OFF signals are input to the first gate terminal 41 and the second gate terminal 42, so that the IGBT 4 continues the OFF state.

When the time L elapses from the time point t60, a time point t63 is reached. The time point t63 is also a time point when the time (1−D)T elapses from the time point t61. At the time point t63, the signals B and H are both at the ON level, and the ON signals are input to the first gate terminal 41 and the second gate terminal 42. Therefore, the IGBT 4 is turned on in the high injection mode.

When the time DT elapses from the time point t60, a time point t64 is reached. At the time point t64, the signal H becomes the OFF level and the OFF signal is input to the second gate terminal 42, so that the IGBT 4 switches to the low injection mode. The time point t64 in the current cycle is a time point corresponding to the time point t69 in the previous cycle.

When the time (1−D)T elapses from the time point t64, a time point t65 is reached. The time point t65 is also a time point when the time T elapses from the time point t60. At the time point t65, the signal A rises again and shifts to the next cycle.

According to the operation described above, the IGBT 4 is turned off at the time point t61, but the IGBT 4 is kept in the low injection mode during a period immediately before that (a previous cycle) from the time point t69 to the time point t61. Therefore, the turn-off loss of the IGBT 4 at the time point t61 is small. Therefore, according to the present embodiment, when the relationship of Formula 2 or Formula 5 is satisfied, the problem that there is a concern that the turn-off loss of the IGBT 4 occurring in the first embodiment of the invention may be increased can be solved.

Regarding the on-time ratio D, under the conditions other than those shown in FIG. 15, that is, under the conditions satisfying Formula 1 or Formula 4, and Formula 3 or Formula 6, the present embodiment has similar effects as the first embodiment of the invention, but the details have already been described in the first embodiment, so that detailed description is omitted.

Fourth Embodiment

A fourth embodiment of the invention will be described below with reference to FIGS. 16 and 17.

When the IGBT 4 having two gate terminals is used, if the IGBT 4 is turned on in the low injection mode and is switched to the high injection mode after a certain period of time, electromagnetic noise generated from the IGBT 4 can be reduced. The reason why the electromagnetic noise generated from the IGBT 4 can be reduced by operating in this way can be explained as follows.

When the IGBT 4 is turned on, a current starts to flow through the IGBT 4 by injecting charges from an insulated gate into the IGBT 4. Therefore, a time change rate of a current starting to flow in the IGBT 4 has a positive correlation with a magnitude of the charge amount injected from the insulated gate. That is, when a large amount of charges are injected from the insulated gate at the time of turn-on, the IGBT 4 is rapidly turned on, and the time change rate of the current becomes large.

On the other hand, if the charge amount injected from the insulated gate at the time of turn-on is reduced, the IGBT 4 is turned on slowly, and the time change rate of the current becomes small. The time change rate of the current is one of the indexes for evaluating a magnitude of the electromagnetic noise, and has a positive correlation with the magnitude of the electromagnetic noise. If the electromagnetic noise is large, a normal operation of the semiconductor device 1 itself and the devices installed around the semiconductor device 1 may be hindered. Therefore, from a viewpoint of reducing electromagnetic noise, it is desirable to reduce the time change rate of the current to be small.

When the IGBT 4 is turned on in the high injection mode, the charges are injected from both of the two insulated gates, so that the time change rate of the current becomes large. On the other hand, when the IGBT 4 is turned on in the low injection mode, the charges are injected from only one insulated gate, so that an amount is limited, and the time change rate of the current becomes small. Therefore, when the IGBT 4 is turned on in the low injection mode, the electromagnetic noise generated from the IGBT 4 can be reduced.

After turning on the IGBT 4 in the low injection mode, it is desirable to switch to the high injection mode after a certain period of time. After the certain period of time after the IGBT 4 is turned on, the current reaches a steady state, and its time change rate becomes negligibly small (from a viewpoint of electromagnetic noise). Therefore, if the IGBT 4 is switched to the high injection mode after the time change rate of the current becomes sufficiently small, the electromagnetic noise does not increase. When the IGBT 4 is switched to the high injection mode, a subsequent conduction loss is reduced, which is effective in reducing the loss.

As described above, the reason why the electromagnetic noise generated from the IGBT 4 can be reduced by turning on the IGBT 4 in the low injection mode and switching to the high injection mode after a certain period of time.

Figure 16:
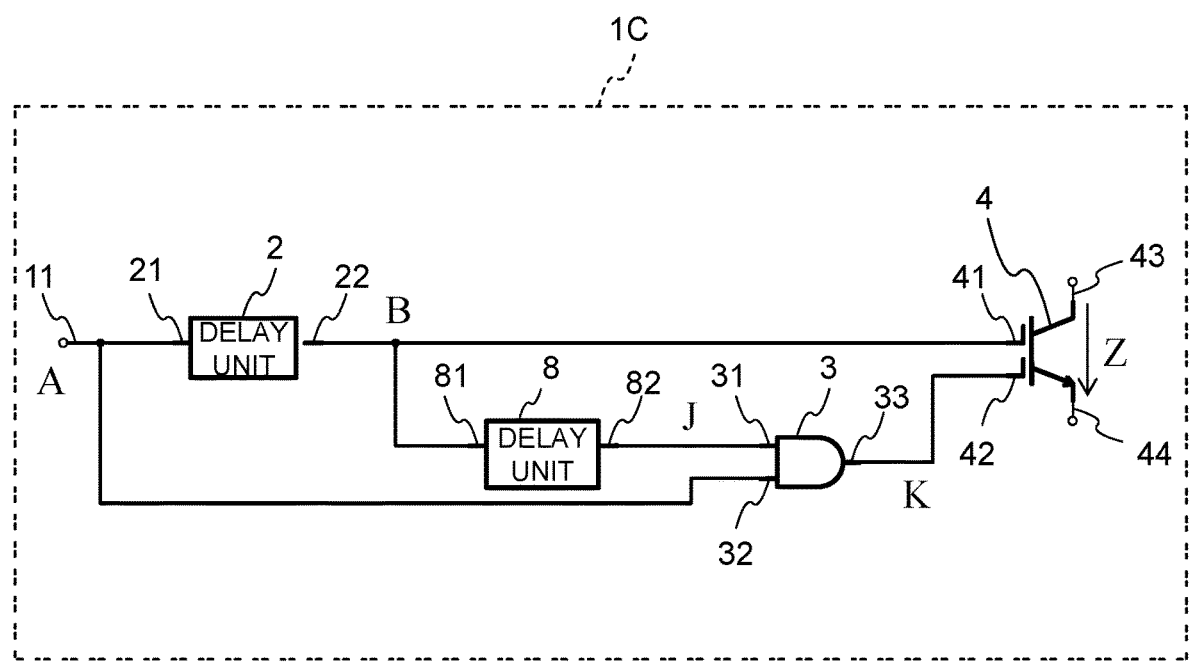
FIG. 16 is a diagram showing a semiconductor device according to a fourth embodiment.

FIG. 16 shows a semiconductor device 1C according to the fourth embodiment.

The semiconductor device 1C includes the control signal input terminal 11, the IGBT 4, the delay unit 2, the logical product unit 3, and a second delay unit 8.

The IGBT 4 has the first gate terminal 41, the second gate terminal 42, the collector terminal 43, and the emitter terminal 44. The function of the IGBT 4 will be described with reference to FIGS. 3 and 4.

The delay unit 2 has the input terminal 21 and the output terminal 22. The delay unit 2 is a first delay unit having a function of delaying a signal input to the input terminal 21 for a first predetermined time and then outputting the signal from the output terminal 22, and the delay time is L1.

The logical product unit 3 has the first input terminal 31, the second input terminal 32, and the output terminal 33. The logical product unit 3 has a function of calculating a logical product of the signals input to the first input terminal 31 and the second input terminal 32 and outputting the logical product from the output terminal 33.

The second delay unit 8 has an input terminal 81 and an output terminal 82. The second delay unit 8 has a function of delaying a signal input to the input terminal 81 for a second predetermined time and then outputting the signal from the output terminal 82, and the delay time is L2.

The control signal input terminal 11 is connected to the input terminal 21 of the delay unit 2 and the second input terminal 32 of the logical product unit 3. The output terminal 22 of the delay unit 2 is connected to the input terminal 81 of the second delay unit 8 and the first gate terminal 41 of the IGBT 4. The output terminal 82 of the second delay unit 8 is connected to the first input terminal 31 of the logical product unit 3. The output terminal 33 of the logical product unit 3 is connected to the second gate terminal 42 of the IGBT 4. That is, the second delay unit 8 is inserted between the output terminal 22 of the delay unit 2 and the first input terminal 31 of the logical product unit 3.

The signal A is a signal input to the control signal input terminal 11. The signal B is a signal output by the delay unit 2 and is delayed from the signal A for the first predetermined time. A signal J is a signal output by the second delay unit 8 and is delayed from the signal B for the second predetermined time. A signal K is a signal output by the logical product unit 3, and is a logical product of the signal A and the signal J.

Figure 17:
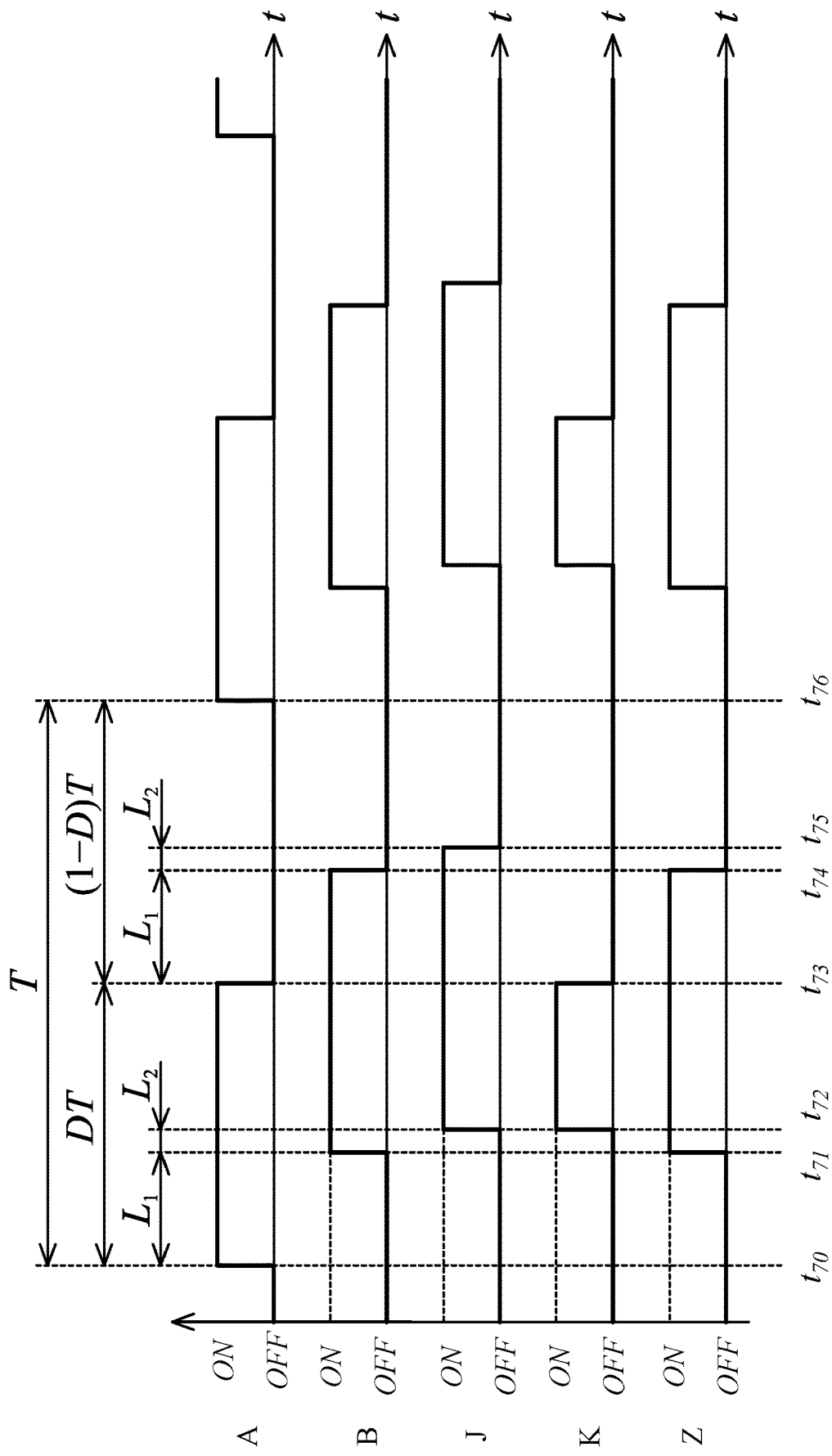
FIG. 17 is a diagram showing a waveform of a control signal input to the semiconductor device, waveforms of signals inside the semiconductor device, and a state according to the fourth embodiment.

FIG. 17 shows an example of a waveform of a control signal input to the semiconductor device 1C, waveforms of signals inside the semiconductor device 1C, and a state.

The signal A is a pulse signal input to the control signal input terminal 11, and repeats ON and OFF. As shown in FIG. 17, a period from rising of any on-pulse of the signal A to rising of the next on-pulse is defined as the cycle T. A ratio of an on-pulse width in the cycle T is defined as an on-time ratio D. That is, the on-time ratio D can take a value in a range of 0 to 1, and the on-pulse width is represented by DT, and the off-pulse width is represented by (1−D)T. The operation holds for the relationship that the on-pulse width DT is equal to or larger than the delay time L1 and the off-pulse width (1−D)T is larger than the delay time L1 shown in FIG. 17. When this condition is organized for D, it is represented by the following Formula 9.

[Math 9]

$$L_1/T \leq D < 1 - L_1/T \tag{9}$$

In Formula 9, D: on-time ratio
$L_1$: delay time of first delay unit
T: cycle

The signal B is a signal output from the output terminal 22 of the delay unit 2. The signal B passes through the delay unit 2, so that the signal B is delayed for the delay time L1 as compared with the signal A.

The signal J is a signal output from the output terminal 82 of the second delay unit 8. The signal J passes through the second delay unit 8, so that the signal J is delayed for the delay time L2 as compared with the signal B.

The signal K is a signal output from the output terminal 33 of the logical product unit 3. From a connection relationship shown in FIG. 17, the signal K is the logical product of the signal A and the signal J. The signal B is input to the first gate terminal 41, and the signal K is input to the second gate terminal 42.

A state Z represents the ON and OFF states of the IGBT 4. Since the IGBT 4 is in the ON state when an ON signal is input to any of the gate terminals, the state Z is the logical sum of the signal B and the signal K.

An operation of one cycle of the IGBT 4 will be described in a chronological order based on a relationship between the signals A, B, J, and K and the state Z in FIG. 17.

Immediately before a time point t70, the signals B and K are both at the OFF level, and OFF signals are input to the first gate terminal 41 and the second gate terminal 42. Therefore, the IGBT 4 is in the OFF state.

At the time point t70, the signal A rises. The signals B and K maintain the OFF level and the OFF signals are input to the first gate terminal 41 and the second gate terminal 42, so that the IGBT 4 continues the OFF state.

When the time L1 elapses from the time point t70, a time point t71 is reached. At the time point t71, the signal B becomes the ON level and the ON signal is input to the first gate terminal 41, so that the IGBT 4 is turned on in the low injection mode. When the IGBT 4 is turned on in the low injection mode, the charges are injected from only one insulated gate, so that the amount is limited, and the time change rate of the current becomes small. Therefore, the electromagnetic noise generated from the IGBT 4 can be reduced.

When the time L2 elapses from the time point t71, a time point t72 is reached. At this time point t72, the signal K becomes the ON level and the ON signal is input to the second gate terminal 42, so that the IGBT 4 switches to the high injection mode. When the time L2 elapses after the IGBT 4 is turned on at the time point t71, the current reaches a steady state, and its time change rate becomes negligibly small from the viewpoint of the electromagnetic noise. Therefore, when the IGBT 4 is switched to the high injection mode at the time point t72, the electromagnetic noise does not increase. When the IGBT 4 is switched to the high injection mode, the conduction loss is reduced.

When the time DT elapses from the time point t70, a time point t73 is reached. At the time point t73, the signal K becomes the OFF level and the OFF signal is input to the second gate terminal 42, so that the IGBT 4 switches to the low injection mode.

When the time L1 elapses from the time point t73, a time point t74 is reached. At the time point t74, the signal B becomes the OFF level and the OFF signal is input to the first gate terminal 41, so that the IGBT 4 is turned off.

When the time L2 elapses from the time point t74, a time point t75 is reached. At the time point t75, the signal J falls. The signals B and K maintain the OFF level and the OFF signals are input to the first gate terminal 41 and the second gate terminal 42, so that the IGBT 4 continues the OFF state.

When the time (1−D)T elapses from the time point t73, a time point t76 is reached. The time point t76 is also a time point when the time T elapses from the time point t70. At the time point t76, the signal A rises again and shifts to the next cycle.

According to the operation described above, at the time point t71, the IGBT 4 is turned on in the low injection mode, and keeps the low injection mode over a period from the time point t71 to the time point t72. A length of this period is equal to L2. Thereafter, at the time point t72, the IGBT 4 switches to the high injection mode. Therefore, when the control signal shown by the signal A in FIG. 17 is input to the semiconductor device 1C, the IGBT 4 can reduce an increase in the electromagnetic noise generated from the IGBT 4.

The present embodiment has the same effect as the first embodiment of the invention under the conditions other than those shown in FIG. 17, that is, the condition of the following Formula 10, for the on-time ratio D.

[Math 10]

$$D \geq 1 - L_1/T \qquad (10)$$

Further, under the condition of the following Formula 11, the present embodiment has the same effect as the first embodiment of the invention, but since the aspect has already been described in the first embodiment, a detailed description is omitted.

[Math 11]

$$D < L_1/T \qquad (11)$$

It can be seen that, by comparing the first embodiment with the fourth embodiment of the invention, a circuit structural characteristic of the fourth embodiment is that the second delay unit 8 is inserted immediately before the first input terminal 31 included in the logical product unit 3. Therefore, the effect of reducing the electromagnetic noise obtained in the fourth embodiment of the invention is not limited to the configuration shown in FIG. 12, and by inserting the second delay unit immediately before the first input terminal included in the logical product unit, it is possible to expand to the first to third embodiments of the invention.

Magnitudes of the delay time L according to the first to third embodiments of the invention and the delay time L1 according to the fourth embodiment described above are equal to the time during which the IGBT 4 is kept in the low injection mode immediately before the IGBT 4 is turned off. When the delay time L or L1 is short, the time during which the IGBT 4 is kept in the low injection mode is short, so that the accumulated charge amount cannot be sufficiently reduced, and the effect of reducing the turn-off loss is reduced. On the other hand, when the delay time L is long, the effect of reducing the turn-off loss is large, but the conduction loss becomes large. Therefore, the delay time L or L1 has a suitable value that minimizes a sum of the turn-off loss and the conduction loss.

According to the study by the inventor, the suitable value differs depending on the structure and a rated voltage of the IGBT 4, but the delay time L or L1 is preferably any one in a range of about 3 μs to 60 μs.

As described above, according to the third embodiment of the invention, the width M of the pulse output by the one-shot pulse generation unit is set in a range shown by Formula 8. According to the study by the inventor, the off-pulse width (1−D)T can take various values depending on specifications of the power conversion device using the semiconductor device, but at least about 1 μs is ensured. Therefore, in consideration of the above range of the suitable value of the delay time L, the width M of the pulse output by the one-shot pulse generation unit is set to any one in the range of about 3 μs to 60 μs.

As described above, according to the fourth embodiment of the invention, a magnitude of the delay time L2 is equal to time that the IGBT 4 is kept in the low injection mode after the IGBT 4 is turned on in the low injection mode. When the delay time L2 is short, the time for keeping the IGBT 4 in the low injection mode is short, so that the mode is switched to the high injection mode before the time change rate of the current of the IGBT 4 becomes sufficiently small, and the effect of reducing electromagnetic noise is reduced. On the other hand, when the delay time L2 is long, the conduction loss increases even though the effect of reducing electromagnetic noise is saturated. Therefore, the delay time L2 has a suitable value that achieves both a reduction in the electromagnetic noise and a reduction in the conduction loss.

According to the study by the inventor, the suitable value differs depending on the structure and the rated voltage of the IGBT 4, but the delay time L2 is preferably any one in a range of about 0.3 μs to 3 μs.

Modified Example

The invention is not limited to the embodiments described above, and includes various modified examples. For example, the embodiments described above have been described in detail for easy understanding of the invention, and the invention is not necessarily limited to those including all the configurations described above. A part of the configuration of one embodiment can be replaced with the configuration of another embodiment, and the configuration of another embodiment can also be added to the configuration of one embodiment. Other configurations may be added to, deleted from or replaced with a part of a configuration of each embodiment.

A part or all of the above configurations, functions, processing units, processing methods, and the like may be implemented by hardware such as an integrated circuit. The above configurations, functions, and the like may be implemented by software by a processor interpreting and executing a program that implements each function. Information such as programs, tables, and files that implement each function can be stored on a recording device such as a memory, hard disk, or solid state drive (SSD), or on a recording medium such as a flash memory card or digital versatile disk (DVD).

In the embodiments, control lines and the information lines show those which are considered necessary for the description, and do not necessarily show all the control lines and the information lines on a product. In fact, it may be considered that almost all components are interconnected.

Modified example of the invention includes, for example, the following (a) to (c).

(a) The switching element of the semiconductor device of the invention is not limited to the IGBT, and may be, for example, a gate turn-off thyristor, an integrated gate commutated turn-off thyristor (IGCT) or a metal-oxide-semiconductor field-effect transistor (MOSFET).

(b) A control method of the second embodiment described above may be applied to the semiconductor device of the third embodiment or the semiconductor device of the fourth embodiment.

(c) The pulse signal input to the control signal input terminal is not limited to a PWM signal, and may be a pulse modulation signal of any type.

REFERENCE SIGN LIST

1, 1A, 1B, 1C: semiconductor device
11: control signal input terminal
2: delay unit (first delay unit)
21: input terminal
22: output terminal
3: logical product unit
31: first input terminal
32: second input terminal
33: output terminal
4: IGBT
41: first gate terminal (first control terminal)
411: first gate
42: second gate terminal (second control terminal)
421: second gate
43: collector terminal
431: collector
44: emitter terminal
441: emitter
45: P layer
451: N+ layer
46: N− substrate
47: P layer
48: carrier
49: gate oxide film
5: delay unit
51: input terminal
52: output terminal
6: one-shot pulse generation unit
61: input terminal
62: output terminal
7: logical negative unit
71: input terminal
72: output terminal
8: second delay unit
81: input terminal
82: output terminal
9: PWM output unit
A, B, C, D, E, F, G, H, J, K: signal
Z: state

The invention claimed is:

1. A semiconductor device, comprising:
a control signal input terminal;
a switching element having a first control terminal and a second control terminal;
a first delay unit configured to delay an input signal for a first predetermined time; and
a logical product unit configured to calculate a logical product of a first input terminal and a second input terminal, wherein
the control signal input terminal is connected to an input terminal of the first delay unit and the second input terminal of the logical product unit,
an output terminal of the first delay unit is connected to the first control terminal of the switching element and the first input terminal of the logical product unit, and
an output terminal of the logical product unit is connected to the second control terminal of the switching element.

2. The semiconductor device according to claim 1, wherein
the first predetermined time delayed by the first delay unit is any one of 3 μs to 60 μs.

3. The semiconductor device according to claim 1, further comprising:
a one-shot pulse generation unit of a falling edge trigger type; and
a logical negative unit configured to invert an input signal and outputs the signal, wherein
the one-shot pulse generation unit and the logical negative unit are connected in series and inserted between the control signal input terminal and the second input terminal of the logical product unit.

4. The semiconductor device according to claim 3, wherein
a width of a pulse generated by the one-shot pulse generation unit is any one of 3 μs to 60 μs.

5. The semiconductor device according to claim 1, further comprising:
a second delay unit configured to delay an input signal for a second predetermined time; and
the second delay unit is inserted between the output terminal of the first delay unit and the first input terminal of the logical product unit.

6. The semiconductor device according to claim 5, wherein
the second predetermined time delayed by the second delay unit is any one of 0.3 μs to 3 μs.

7. A method for controlling a semiconductor device, the method comprising:
outputting a signal which is a pulse of a predetermined cycle and whose off period is longer than the first predetermined time delayed by the first delay unit to the control signal input terminal of the semiconductor device according to claim 1.

8. A control circuit for a semiconductor device, comprising:
a control signal input terminal;
a first delay unit configured to delay an input signal for a first predetermined time; and
a logical product unit configured to calculate a logical product of a first input terminal and a second input terminal, wherein
the control signal input terminal is connected to an input terminal of the first delay unit and the second input terminal of the logical product unit,
an output terminal of the first delay unit is connected to a first control terminal of a switching element having the first control terminal and a second control terminal and the first input terminal of the logical product unit, and
an output terminal of the logical product unit is connected to the second control terminal of the switching element.

* * * * *